(12) United States Patent
Ebihara et al.

(10) Patent No.: US 11,018,160 B2
(45) Date of Patent: May 25, 2021

(54) THIN-FILM TRANSISTOR SUBSTRATE AND LUMINESCENT DEVICE

(71) Applicant: JOLED INC., Tokyo (JP)

(72) Inventors: Ryosuke Ebihara, Tokyo (JP); Yasuhiro Terai, Tokyo (JP); Atsuhito Murai, Tokyo (JP)

(73) Assignee: JOLED INC., Tokyo (JP)

( * ) Notice: Subject to any disclaimer, the term of this patent is extended or adjusted under 35 U.S.C. 154(b) by 46 days.

(21) Appl. No.: 16/434,425

(22) Filed: Jun. 7, 2019

(65) Prior Publication Data

US 2020/0027900 A1 Jan. 23, 2020

(30) Foreign Application Priority Data

Jul. 23, 2018 (JP) .............................. JP2018-137876

(51) Int. Cl.
*H01L 27/14* (2006.01)
*H01L 27/12* (2006.01)
*H01L 27/32* (2006.01)

(52) U.S. Cl.
CPC ........ *H01L 27/124* (2013.01); *H01L 27/1225* (2013.01); *H01L 27/1248* (2013.01); *H01L 27/1288* (2013.01); *H01L 27/3276* (2013.01)

(58) Field of Classification Search
CPC . H01L 27/32; H01L 27/3246; H01L 27/3276; H01L 51/5228; H01L 51/5271
See application file for complete search history.

(56) References Cited

U.S. PATENT DOCUMENTS

| | | | |
|---|---|---|---|
| 2006/0115944 A1* | 6/2006 | Kwak | H01L 27/0688 438/199 |
| 2014/0284594 A1 | 9/2014 | Nakano et al. | |
| 2015/0187823 A1* | 7/2015 | Miyairi | H01L 27/1225 257/43 |
| 2017/0288174 A1* | 10/2017 | Ueda | H01L 51/5228 |
| 2018/0182836 A1 | 6/2018 | Beak et al. | |

FOREIGN PATENT DOCUMENTS

| | | |
|---|---|---|
| JP | 2007264177 A | 10/2007 |
| JP | 2014-183238 A | 9/2014 |

* cited by examiner

*Primary Examiner* — Phuc T Dang
(74) *Attorney, Agent, or Firm* — Hauptman Ham, LLP

(57) ABSTRACT

A thin-film transistor substrate includes a pixel circuit, an interlayer insulating film, electrodes, and a hard mask metal. The pixel circuit includes a thin film transistor. The interlayer insulating film has contact holes and covers the pixel circuit. The electrodes are exposed above a surface of the interlayer insulating film, and electrically coupled to the pixel circuit via the contact holes. The hard mask metal has openings at portions facing the contact holes and is provided on the surface of the interlayer insulating film.

4 Claims, 35 Drawing Sheets

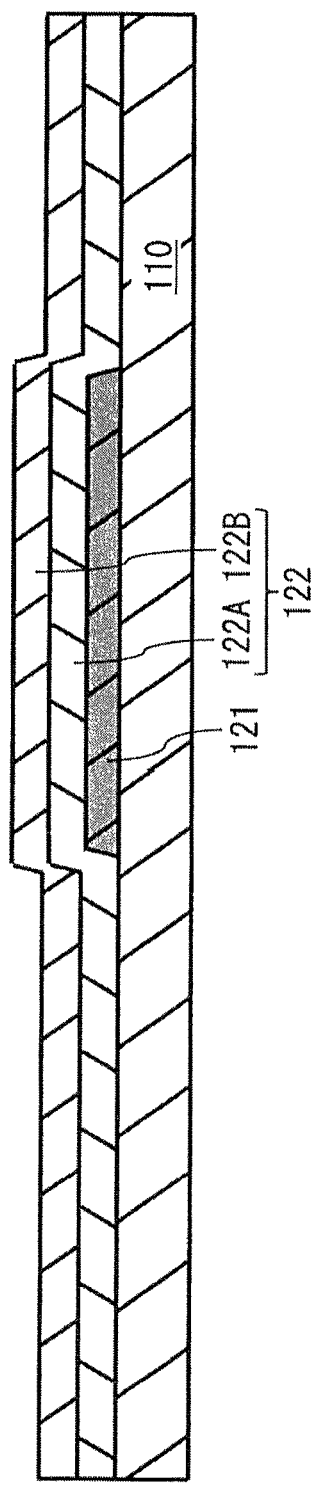

THIN-FILM TRANSISTOR SUBSTRATE AND LUMINESCENT DEVICE

CROSS REFERENCE TO RELATED APPLICATIONS

This application claims the benefit of Japanese Priority Patent Application No. 2018-137876 filed on Jul. 23, 2018, the entire contents of which are incorporated herein by reference.

BACKGROUND

The disclosure relates to a thin-film transistor substrate and a luminescent device.

Thin-film semiconductor devices, such as thin film transistors (TFTs), have found their applications in a variety of apparatuses including active-matrix display units, such as liquid crystal display units, and solid-state imaging units, such as digital cameras. In such a display unit, TFTs serve as switching devices that select pixels, while other TFTs serve as driving transistors that drive the pixels, for example. A TFT otherwise serve as a driver provided outside of a display region, for example.

For example, an organic electro luminescence (EL) display including organic EL devices each including an organic luminescent material is not a voltage-driven liquid crystal display, but a current-driven display device. TFTs offering further superior performance for such purposes have been under intense development. Such development has been focused on TFTs each including, as a channel layer, an oxide semiconductor, such as InGaZnO, as disclosed in Japanese Unexamined Patent Application Publication No. 2014-183238, for example.

SUMMARY

With an increasing need for high-definition organic electroluminescent devices, a contact size has been reduced. When an ordinary exposure technology is used to provide contact holes on an interlayer insulating film including an organic substance, the contact holes however expand in size. This makes it difficult to achieve a high-definition organic electroluminescent device.

It is desirable to provide a thin-film transistor substrate having contact holes appropriate for contributing to achievement of a high-definition organic electroluminescent device, as well as to provide a luminescent device including such a thin-film transistor substrate.

A thin-film transistor substrate according to one example embodiment of the technology includes: a pixel circuit including a thin film transistor; an interlayer insulating film having contact holes, the interlayer insulating film being provided to cover the pixel circuit; electrodes exposed above a surface of the interlayer insulating film, the electrodes being electrically coupled to the pixel circuit via the contact holes; and a hard mask metal having openings at portions facing the contact holes, the hard mask metal being provided on the surface of the interlayer insulating film.

A luminescent device according to one example embodiment of the technology includes: on a thin-film transistor substrate, a luminescent panel including a luminescent element per a pixel; and a driving circuit that drives the luminescent panel. The thin-film transistor substrate includes: a pixel circuit including a thin film transistor; an interlayer insulating film having contact holes, the interlayer insulating film being provided to cover the pixel circuit; electrodes exposed above a surface of the interlayer insulating film, the electrodes being electrically coupled to the pixel circuit via the contact holes; and a hard mask metal having openings at portions facing the contact holes, the hard mask metal being provided on the surface of the interlayer insulating film.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

FIG. 5D is a schematic cross-sectional view of a TFT substrate according to one example embodiment of the technology for illustration of an example process following the process illustrated in FIG. 5C.

FIG. 5O is a schematic cross-sectional view of a TFT substrate according to one example embodiment of the technology for illustration of an example process following the process illustrated in FIG. 5N.

DETAILED DESCRIPTION

Figure 1:
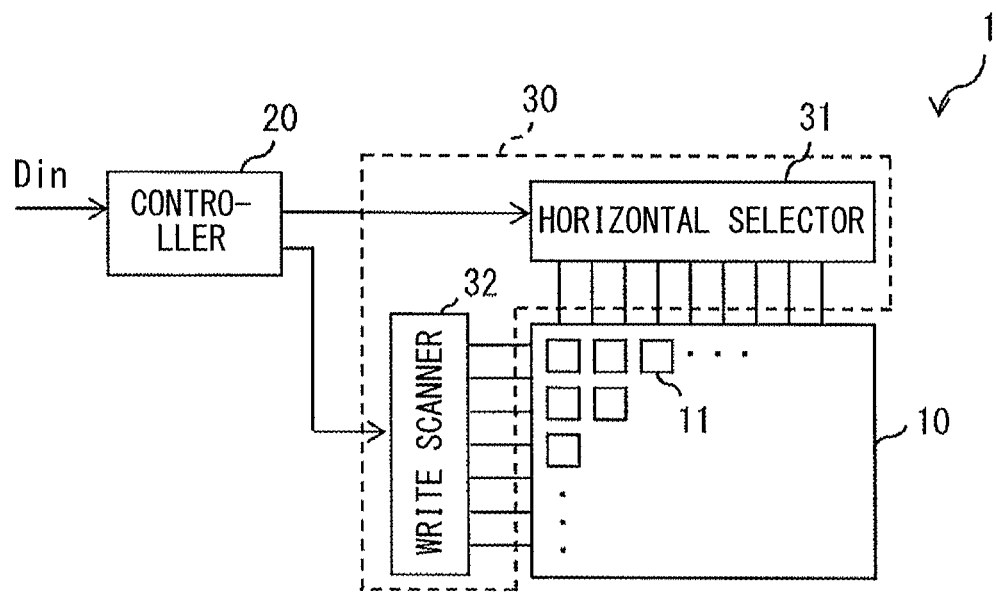
FIG. 1 is a schematic block diagram of an organic electroluminescent device having an example configuration according to one embodiment of the technology.

In the following, some example embodiments of the technology are described in detail, in the following order, with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail.

[Embodiments]
[Configuration]

Figure 2:
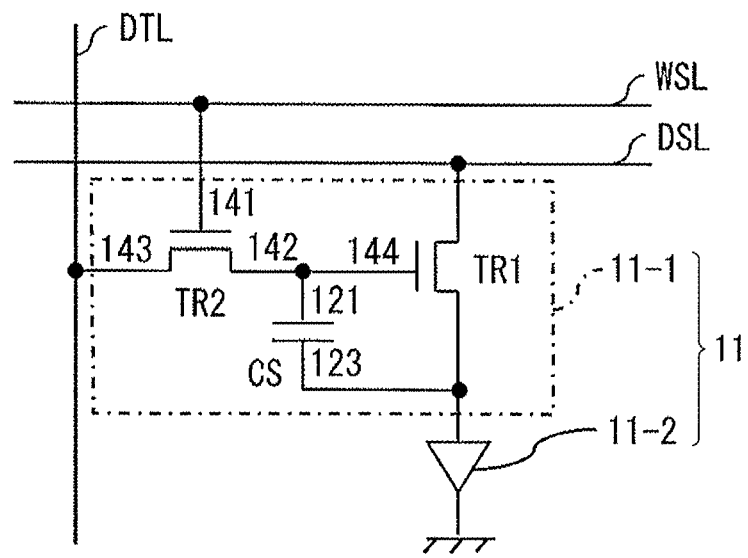
FIG. 2 is a schematic circuit diagram of a pixel having an example configuration according to one example embodiment of the technology.

FIG. 1 illustrates an example configuration of an organic electroluminescent device 1 according to an example embodiment of the technology. The organic electroluminescent device 1 may correspond to a specific but non-limiting example of a "luminescent device" according to one embodiment of the technology. FIG. 2 illustrates an example circuit configuration of any one of a plurality of pixels 11 provided in the organic electroluminescent device 1 according to one embodiment of the technology. The organic electroluminescent device 1 may include an organic electroluminescent panel 10, a controller 20, and a driver 30, for example. The organic electroluminescent panel 10 may correspond to a specific but non-limiting example of a "luminescent panel" according to one embodiment of the technology. The driver 30 may correspond to a specific but non-limiting example of a "driving circuit" according to one embodiment of the technology. The driver 30 may be provided on an outer edge of the organic electroluminescent panel 10, for example. The organic electroluminescent panel 10 may include the plurality of pixels 11 disposed in a matrix. On the basis of an external image signal Din, the controller 20 and the driver 30 may drive the organic electroluminescent panel 10 to drive the plurality of pixels 11.

[Organic Electroluminescent Panel 10]

As the controller 20 and the driver 30 drive the pixels 11 in an active matrix manner, the organic electroluminescent panel 10 may display an image based on the external image signal Din. The organic electroluminescent panel 10 may include a plurality of scanning lines WSL and a plurality of power lines DSL extending along a row axis, a plurality of signal lines DTL extending along a column axis, and the plurality of pixels 11 disposed in a matrix.

The scanning lines WSL may be used to select the pixels 11. The scanning lines WSL may supply, to the pixels 11, selection pulses that select the pixels 11 per a predetermined unit. The predetermined unit may be a pixel row, for example. The signal lines DTL may be used to supply, to the pixels 11, a signal voltage Vsig corresponding to the image signal Din. That is, the signal lines DTL may supply, to the pixels 11, data pulses at the signal voltage Vsig. The power lines DSL may supply electric power to the pixels 11.

The plurality of pixels 11 provided in the organic electroluminescent panel 10 may include the pixels 11 that emit red light, the pixels 11 that emit green light, and the pixels 11 that emit blue light. Hereinafter, the pixels 11 that emit red light are referred to as pixels 11R, the pixels 11 that emit green light as pixels 11G, and the pixels 11 that emit blue light as pixels 11B. In the plurality of pixels 11, one of the pixels 11R, one of the pixels 11G, and one of the pixels 11B may constitute one of display pixels 12. The display pixels 12 will be described later with reference to FIG. 3. Each of the display pixels 12 may represent a unit of displaying a color image. In another example implementation, each of the display pixels 12 may further include pixels 11 that emit other colors, such as white and yellow. In still another example implementation, each of the display pixels 12 may include two or more of the pixels 11 that emit the same color light. For example, each of the display pixels 12 may include two of the pixels 11 that emit blue light. The plurality of pixels 11 provided in the organic electroluminescent panel 10 may be grouped into the display pixels 12 each including a predetermined number of pixels 11. In each of the display pixels 12, the plurality of pixels 11 may be disposed to align with each other in a single column extending along a predetermined axis. The predetermined axis may be the row axis, for example.

The signal lines DTL may be coupled to an output end of a horizontal selector 31 described later. The plurality of signal lines DTL may be respectively allocated to pixel columns one by one, for example. The scanning lines WSL may be coupled to an output end of a write scanner 32 described later. The plurality of scanning lines WSL may be allocated to the respective pixel rows one by one, for example. The power lines DSL may be respectively coupled to an output end of a power source. The plurality of power lines DSL may be allocated to the respective pixel rows one by one, for example.

Each of the pixels 11 may include a pixel circuit 11-1 and an organic electroluminescent element 11-2. The pixel circuit 11-1 may correspond to a specific but non-limiting example of a "pixel circuit" according to one embodiment of the technology. The organic electroluminescent element 11-2 may correspond to a specific but non-limiting example of a "luminescent element" according to one embodiment of the technology. The configuration of the organic electroluminescent element 11-2 will be described later in detail.

The pixel circuit 11-1 may control the light emission of the organic electroluminescent element 11-2. The pixel circuit 11-1 may hold a voltage written into each of the pixels 11 through writing and scanning described later. The pixel circuit 11-1 may include a driving transistor TR1, a switching transistor TR2, and a storage capacitor CS, for example. The driving transistor TR1 and the switching transistor TR2 may correspond to specific but non-limiting examples of "thin film transistors" according to one embodiment of the technology. The storage capacitor CS may correspond to a specific but non-limiting example of a "storage capacitor" according to one embodiment of the technology.

The switching transistor TR2 may control the application of the signal voltage Vsig to a gate of the driving transistor TR1. The signal voltage Vsig may correspond to the image signal Din. In a specific but non-limiting example, the switching transistor TR2 may sample a voltage from each of the signal lines DTL. The switching transistor TR2 may then write the sampled voltage to the gate of the driving transistor TR1. The driving transistor TR1 may be coupled in serial to the organic electroluminescent element 11-2. The driving transistor TR1 may drive the organic electroluminescent element 11-2. The driving transistor TR1 may control a current flowing into the organic electroluminescent element 11-2 in accordance with a magnitude of the voltage sampled by the switching transistor TR2. The storage capacitor CS may be used to hold a predetermined voltage between the gate and a source of the driving transistor TR1. The storage capacitor CS may hold a voltage Vgs at a constant level between the gate and the source of the driving transistor TR1 during a predetermined period of time. The pixel circuit 11-1 may have the two-transistor and-one-capacitor (2TR1C) circuit configuration described above with additional capacitors and transistors. Alternatively, the pixel circuit 11-1 may have a circuit configuration different from such a 2TR1C circuit configuration described above.

The signal lines DTL may be coupled to the output end of the horizontal selector 31 described later, as well as to a source or a drain of the switching transistor TR2. The scanning lines WSL may be coupled to the output end of the write scanner 32 described later, as well as to a gate of the switching transistor TR2. The power lines DSL may be coupled to a power source circuit, as well as to the source or a drain of the driving transistor TR1.

The gate of the switching transistor TR2 may be coupled to each of the scanning lines WSL. The source or the drain of the switching transistor TR2 may be coupled to each of the signal lines DTL. Either the source or the drain of the switching transistor TR2, whichever is not coupled to each of the signal lines DTL, may be coupled to the gate of the driving transistor TR1. The source or the drain of the driving transistor TR1 may be coupled to each of the power lines DSL. Either the source or the drain of the driving transistor TR1, whichever is not coupled to each of the power lines DSL, may be coupled to an anode 21 of the organic electroluminescent element 11-2. One end of the storage capacitor CS may be coupled to the gate of the driving transistor TR1. The other end of the storage capacitor CS may be coupled to either the source or the drain of the driving transistor TR1, whichever lies adjacent to the organic electroluminescent element 11-2.

The driving transistor TR1 and the switching transistor TR2 may be ordinary thin film transistors (TFTs). In a specific but non-limiting example embodiment, the TFTs may each have an inverse stagger structure that is also referred to as a bottom-gate structure. In alternative example embodiment, the TFTs may each have a stagger structure that is also referred to as a top-gate structure, for example.

[Driver 30]

The driver 30 may include the horizontal selector 31 and the write scanner 32, for example. In accordance with or in synchronization with an analog control signal received from the controller 20, for example, the horizontal selector 31 may apply the signal voltage Vsig corresponding to the analog control signal to each of the signal lines DTL. The write scanner 32 may scan the plurality of pixels 11 per predetermined unit.

[Controller 20]

Next, the controller 20 will now be described. The controller 20 may perform a predetermined correction on the external digital image signal Din to generate the signal voltage Vsig on the basis of an image signal obtained through the predetermined correction. The controller 20 may output the generated signal voltage Vsig to the horizontal selector 31, for example. In accordance with or in synchronization with a control signal obtained from the image signal Din, the controller 20 may output the control signal to circuitry in the driver 30.

Figure 3:
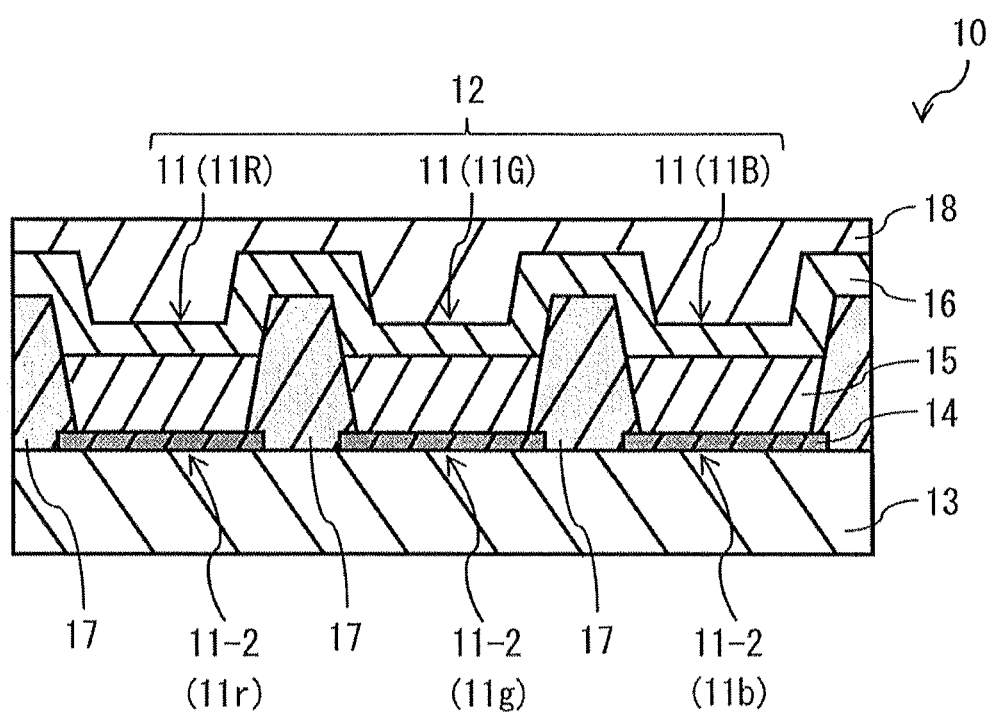
FIG. 3 is a schematic cross-sectional view of an organic electroluminescent panel having an example configuration according to one example embodiment of the technology.

Next, an example configuration of the organic electroluminescent panel 10 will now be described with reference to FIG. 3. FIG. 3 is a schematic cross-sectional view of the organic electroluminescent panel 10 having an example configuration according to an example embodiment of the technology.

The organic electroluminescent panel 10 includes the plurality of pixels 11 disposed in a matrix. The plurality of pixels 11 of the organic electroluminescent panel 10 may include, as described above, the pixels 11R, the pixels 11B, and the pixels 11B. Each of the pixels 11R, each of the pixels 11G, and each of the pixels 11B are allocated to each of the display pixels 12. In another example embodiment, each of the display pixels 12 may further include pixels 11 that emit other colors, such as white and yellow, as described above. In still another example embodiment, each of the display pixels 12 may include two or more of the pixels 11 that emit the same color light, such as two of the pixels 11 that emit blue light.

Each of the pixels 11R may include the organic electroluminescent element 11-2 (11r) that emit red light. Each of the pixels 11G may include the organic electroluminescent element 11-2 (11g) that emit green light. Each of the pixels 11B may include the organic electroluminescent element 11-2 (11b) that emit blue light. The pixels 11R, 11G, and 11B may be disposed in a stripe pattern to align with each other per colors along the row axis. In each of the pixel rows, the plurality of pixels 11 that emits the same color light may be disposed to align with each other along the column axis.

The organic electroluminescent panel 10 includes a TFT substrate 13. The TFT substrate 13 may correspond to a specific but non-limiting example of a "thin-film transistor substrate" according to one embodiment of the technology. The TFT substrate 13 will be described later in detail. The organic electroluminescent panel 10 may include the plurality of pixels 11 on the TFT substrate 13. The organic electroluminescent panel 10 may include the organic electroluminescent element 11-2 for each of the pixels 11 on the TFT substrate 13. The organic electroluminescent panel 10 may further include banks 17 that partition the pixels 11. The banks 17 may each include an insulating resin material, for example. The banks 17 may respectively surround the pixels 11. The banks 17 may be pixel banks or line banks. The organic electroluminescent panel 10 may further include a sealing layer 18 that protect and seal the pixels 11. The sealing layer 18 may include a resin material, such as epoxy resin or vinyl resin, for example.

The organic electroluminescent element 11-2 may include an electrode layer 14, an organic layer 15, and an electrode layer 16 laminated in order from the TFT substrate 13, for example. The organic layer 15 may include a hole injection layer, a hole transport layer, a light-emitting layer, an electron transport layer, and an electron injection layer laminated in order from the TFT substrate 13, for example. The hole injection layer may be provided to increase efficiency in injecting holes. The hole transport layer may be provided to transport holes injected from the electrode layer 13 to the light-emitting layer. The light-emitting layer may be provided to allow electrons and holes to recombine and emit light of a predetermined color. The electron transport layer may be provided to transport electrons injected from the electrode layer 15 to the light-emitting layer. The electron injection layer may be provided to increase efficiency in injecting electrons.

The electrode layer 14 may be provided on the TFT substrate 13, for example. The electrode layer 14 may include one of aluminum (Al) and silver (Ag), or a metal alloy thereof. The electrode layer 14 may be a reflecting electrode having reflectivity, for example. In another example embodiment of the technology, the electrode layer 14 may not be a reflecting electrode, but may be a transparent electrode having transparency, for example. The transparent electrode may include a transparent, electrically-conductive material, such as Indium Tin Oxide (ITO) or Indium Zinc Oxide (IZO), for example. The electrode layer 14 may be laminated with a reflecting electrode and a transparent electrode, for example.

The electrode layer 16 may serve as a transparent electrode including an ITO film, for example. In another example embodiment of the technology, the electrode layer 16 may not serve as a transparent electrode, but may serve as a reflecting electrode having photo-reflectivity. Non-limiting example materials for a reflecting electrode may include aluminum (Al), magnesium (Mg), silver (Ag), an aluminum-lithium metal alloy, and a magnesium-silver metal alloy. In a case where the TFT substrate 13 and the electrode layer 14 have reflectivity, whereas the electrode layer 16 has transparency in the example embodiment, the organic electroluminescent element 11-2 may have a top emission structure where light exits from the electrode layer 16. In a case where the TFT substrate 13 and the electrode layer 14 have transparency, whereas the electrode layer 16 has reflectivity in the example embodiment, the organic electroluminescent element 11-2 may have a bottom emission structure where light exits from the TFT substrate 13.

Figure 4:
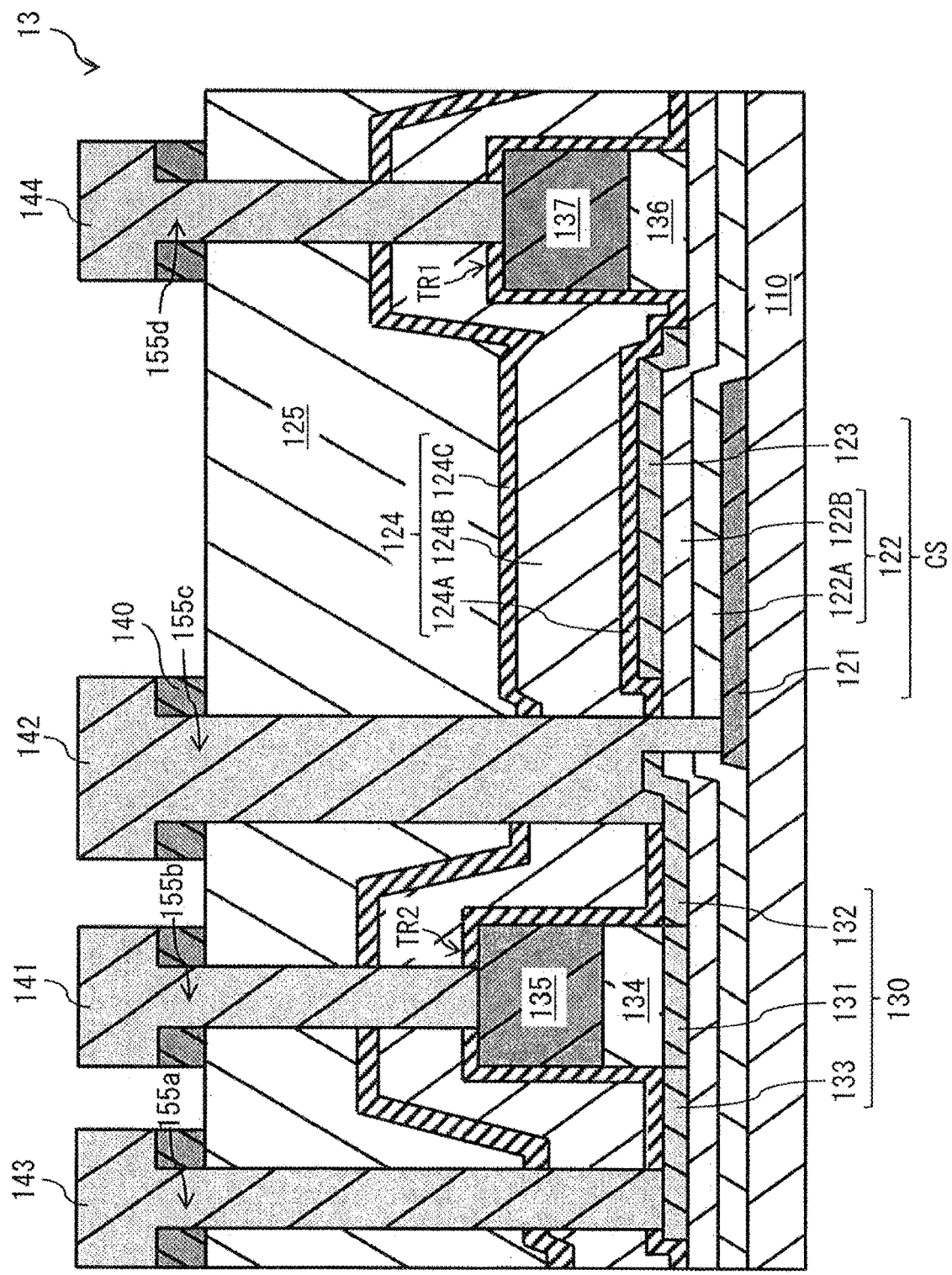
FIG. 4 is a schematic cross-sectional view of a TFT substrate having an example configuration according to one example embodiment of the technology.

Next, the TFT substrate 13 will now be described with reference to FIG. 4. FIG. 4 is a schematic cross-sectional view of the TFT substrate 13 having an example configuration according to an example embodiment of the technology.

The TFT substrate 13 may include the driving transistor TR1, the switching transistor TR2, and the storage capacitor CS on a substrate 110, for example. For example, the driving transistor TR1, the switching transistor TR2, and the storage capacitor CS may constitute the pixel circuit 11-1.

The substrate 110 may include an electrically-insulating material, for example. The substrate 110 may include a glass material, such as non-alkali glass, silica glass, or high heat-resistant glass, or a resin material, such as polyethylene, polypropylene, or polyimide, for example. In a specific but non-limiting example, the substrate 110 may include a flexible substrate, such as a flexible sheet or a flexible film, for example. In a specific but non-limiting example, the substrate 110 may include a single-layered or multi-layered flexible resin substrate including a film material of polyimide, polyethylene terephthalate, or polyethylene naphthalate, for example.

The switching transistor TR2 may include an oxide semiconductor layer 130, a gate insulating layer 134, and a gate electrode 135, for example. The switching transistor TR2 may be coupled with a gate electrode 141, a source electrode 142, and a drain electrode 143, for example. The gate electrode 141, the source electrode 142, and the drain electrode 143 may correspond to specific but non-limiting examples of "electrodes" according to one embodiment of the technology.

The oxide semiconductor layer 130 may serve as a channel layer for the switching transistor TR2. The oxide semiconductor layer 130 may face the gate electrode layer 135 across the gate insulating layer 134. In the example embodiment, the oxide semiconductor layer 130 may be provided on a CS insulating film 122. The CS insulating film 122 may correspond to a specific but non-limiting example of an "interlayer insulating film" according to one embodiment of the technology. The CS insulating film 122 may correspond to a specific but non-limiting example of an "inorganic insulating film" according to one embodiment of the technology.

The oxide semiconductor layer 130 may include a channel region 131, a source region 132, and a drain region 133. The channel region 131 may face the gate electrode 135 across the gate insulating film 134. The source region 132 and the drain region 133 may each serve as a low-resistive region having lower resistivity than resistivity of the channel region 131. To form the source region 132 and the drain region 133, oxygen deficiency may be caused to occur on predetermined regions of a film-formed oxide semiconductor, for example. Example methods for causing oxygen deficiency to occur may include plasma processing using argon (Ar) or hydrogen (H) gas, for example.

The oxide semiconductor layer 130 may include a transparent amorphous oxide semiconductor (TAOS), as a main component, for example. In a specific but non-limiting example, the oxide semiconductor layer 130 may include, as a main component, an oxide of metal, such as indium (In), gallium (Ga), or zinc (Zn), for example. The oxide semiconductor layer 130 may include InGaZnO, InTiZnO, ZnO, InGaO, or InZnO, for example. In a case where InGaZnO is used, an example component ratio of element may be InGaZnOx, for example. The oxide semiconductor layer 130 may have a film thickness in a range from 10 nm to 300 nm, for example.

The gate insulating layer 134 may include silicon oxide, for example. The gate electrode 135 may include an electrically-conductive material, such as metal, or a metal alloy of the electrically-conductive material. The gate electrode 135 may have a single-layer structure or a multilayer structure, for example. Non-limiting example materials for the gate electrode 135 may include aluminum (Al), molybdenum (Mo), tungsten (W), molybdenum tungsten (MoW), copper (Cu), titanium (Ti), and chromium (Cr), for example. The gate electrode 135 may have a film thickness in a range from 50 nm to 300 nm, for example.

Figure 5A:
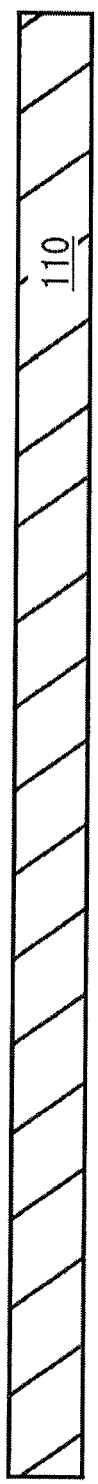
FIG. 5A is a schematic cross-sectional view of a TFT substrate according to one example embodiment of the technology for illustration of an example process of a manufacturing method of the TFT substrate.
Figure 5B:
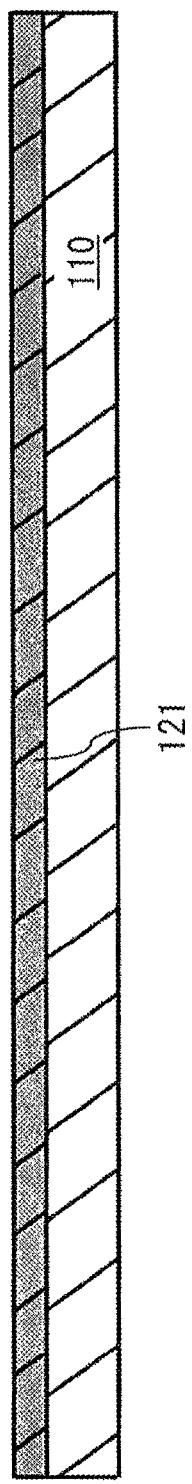
FIG. 5B is a schematic cross-sectional view of a TFT substrate according to one example embodiment of the technology for illustration of an example process following the process illustrated in FIG. 5A.
Figure 5C:
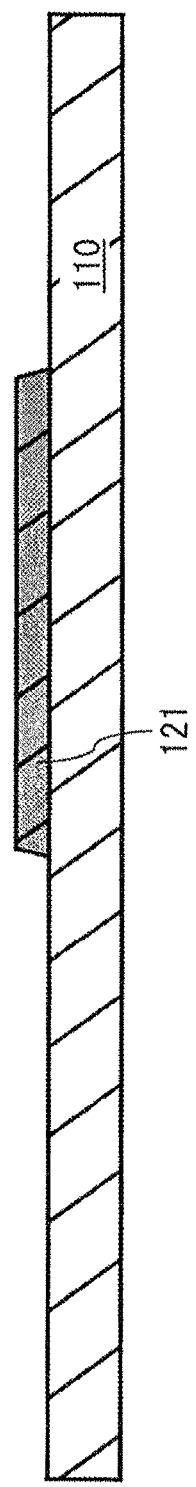
FIG. 5C is a schematic cross-sectional view of a TFT substrate according to one example embodiment of the technology for illustration of an example process following the process illustrated in FIG. 5B.
Figure 5E:
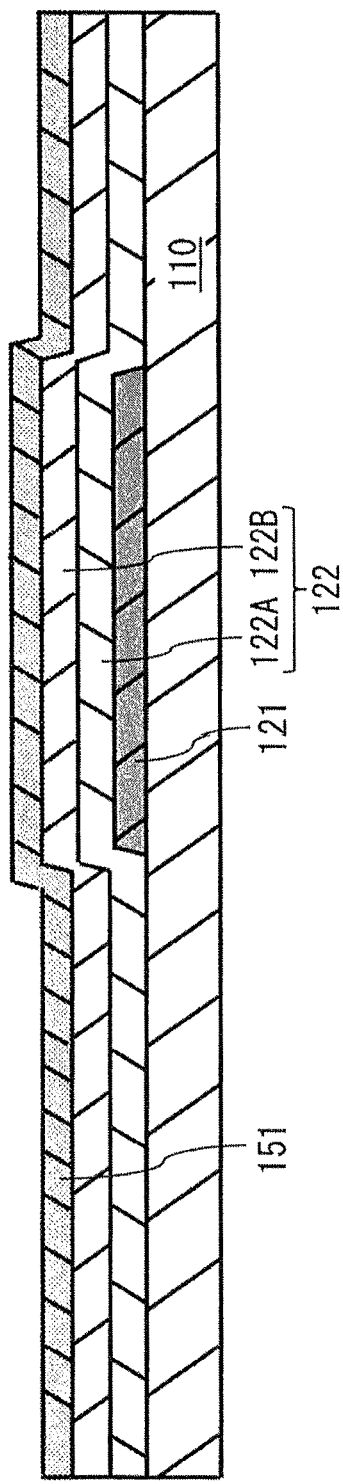
FIG. 5E is a schematic cross-sectional view of a TFT substrate according to one example embodiment of the technology for illustration of an example process following the process illustrated in FIG. 5D.
Figure 5F:
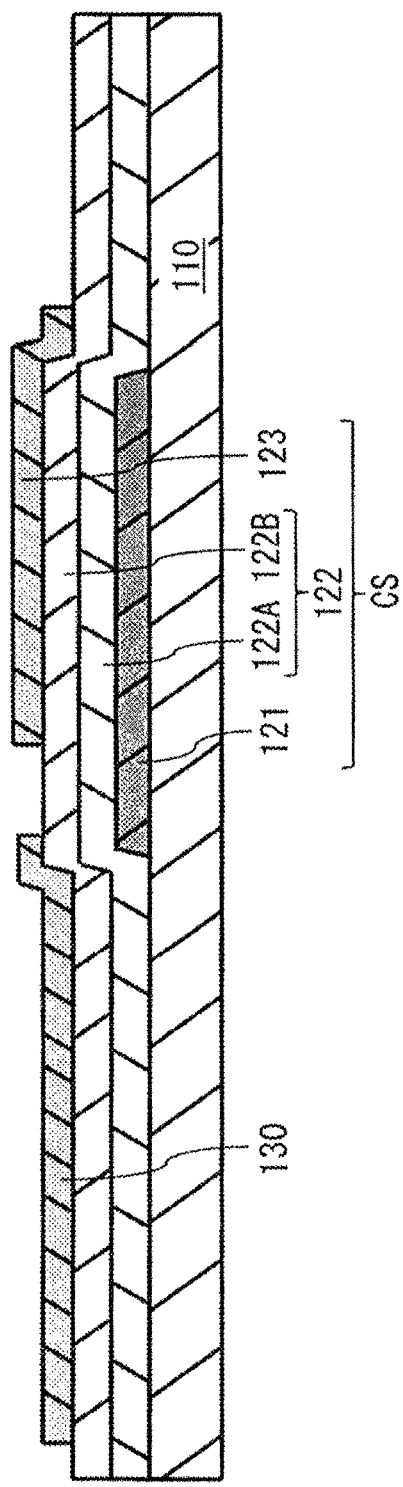
FIG. 5F is a schematic cross-sectional view of a TFT substrate according to one example embodiment of the technology for illustration of an example process following the process illustrated in FIG. 5E.
Figure 5G:
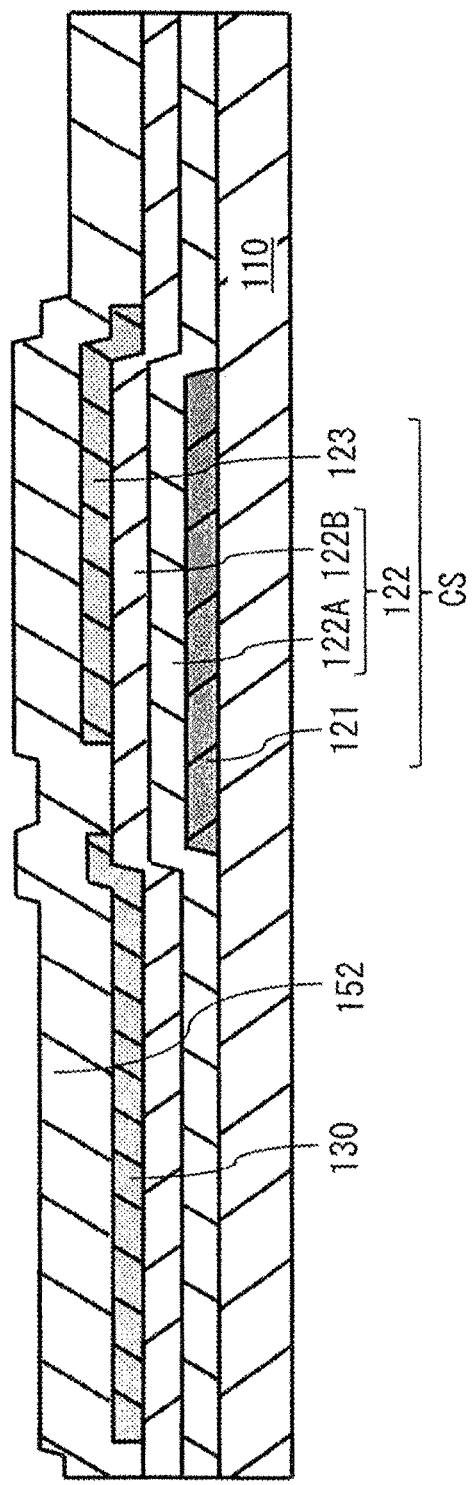
FIG. 5G is a schematic cross-sectional view of a TFT substrate according to one example embodiment of the technology for illustration of an example process following the process illustrated in FIG. 5F.
Figure 5H:
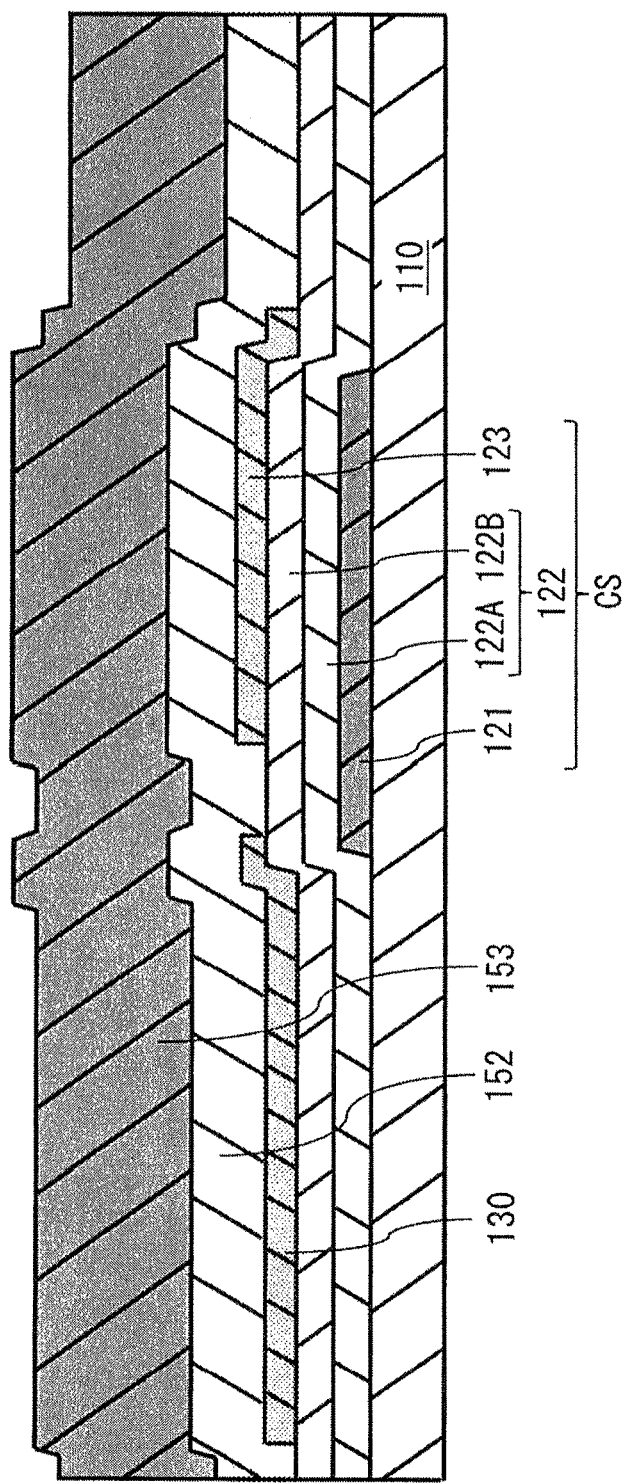
FIG. 5H is a schematic cross-sectional view of a TFT substrate according to one example embodiment of the technology for illustration of an example process following the process illustrated in FIG. 5G.
Figure 5I:
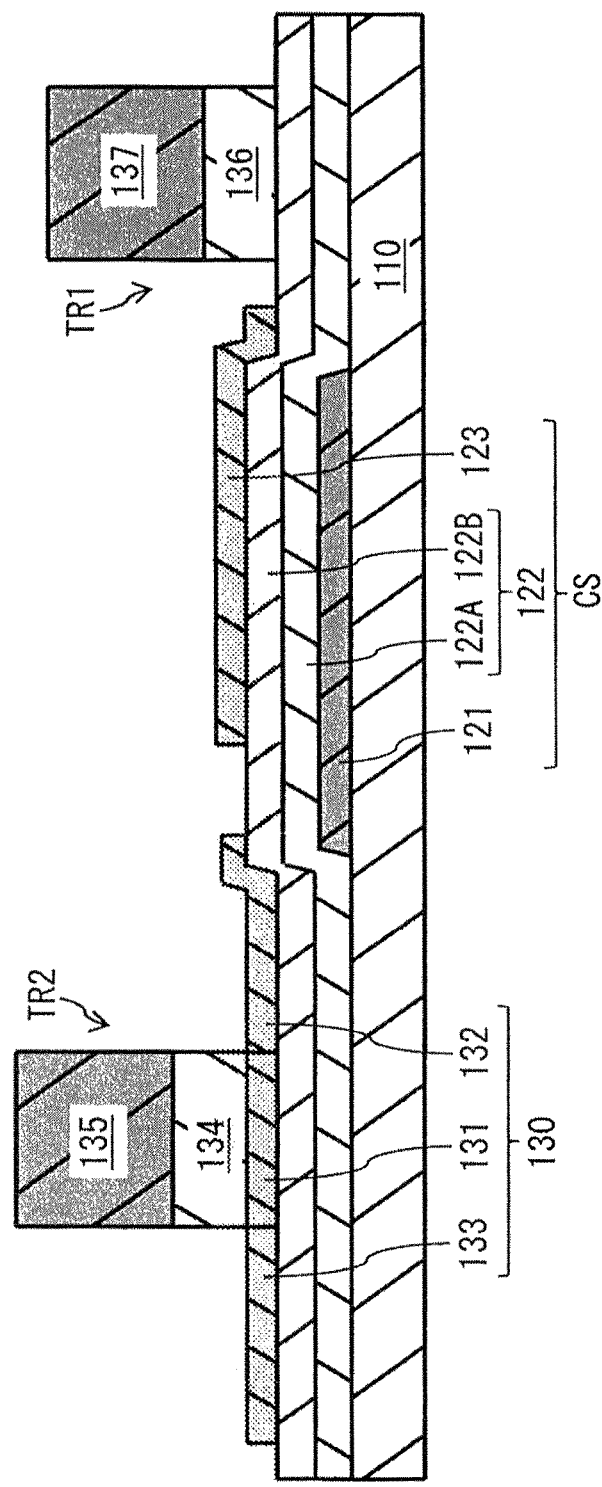
FIG. 5I is a schematic cross-sectional view of a TFT substrate according to one example embodiment of the technology for illustration of an example process following the process illustrated in FIG. 5H.
Figure 5J:
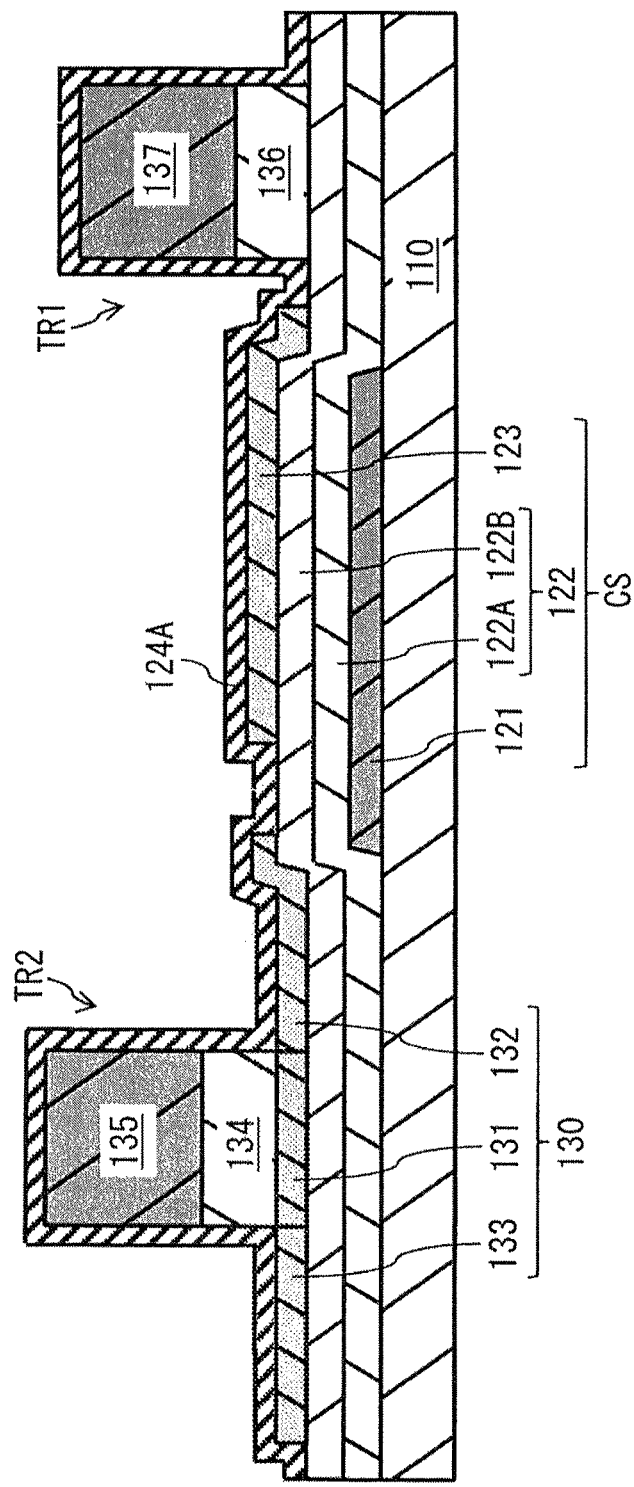
FIG. 5J is a schematic cross-sectional view of a TFT substrate according to one example embodiment of the technology for illustration of an example process following the process illustrated in FIG. 5I.
Figure 5K:
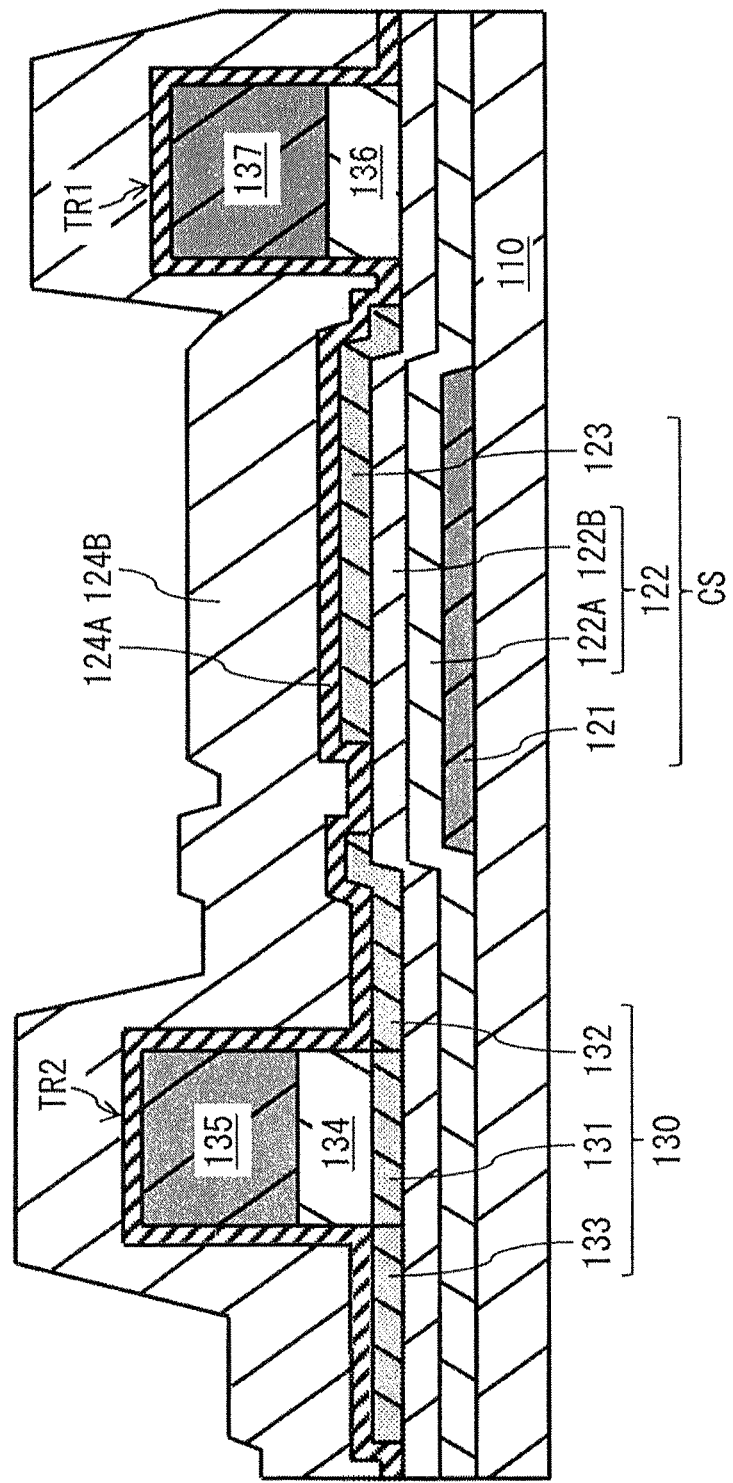
FIG. 5K is a schematic cross-sectional view of a TFT substrate according to one example embodiment of the technology for illustration of an example process following the process illustrated in FIG. 5J.
Figure 5L:
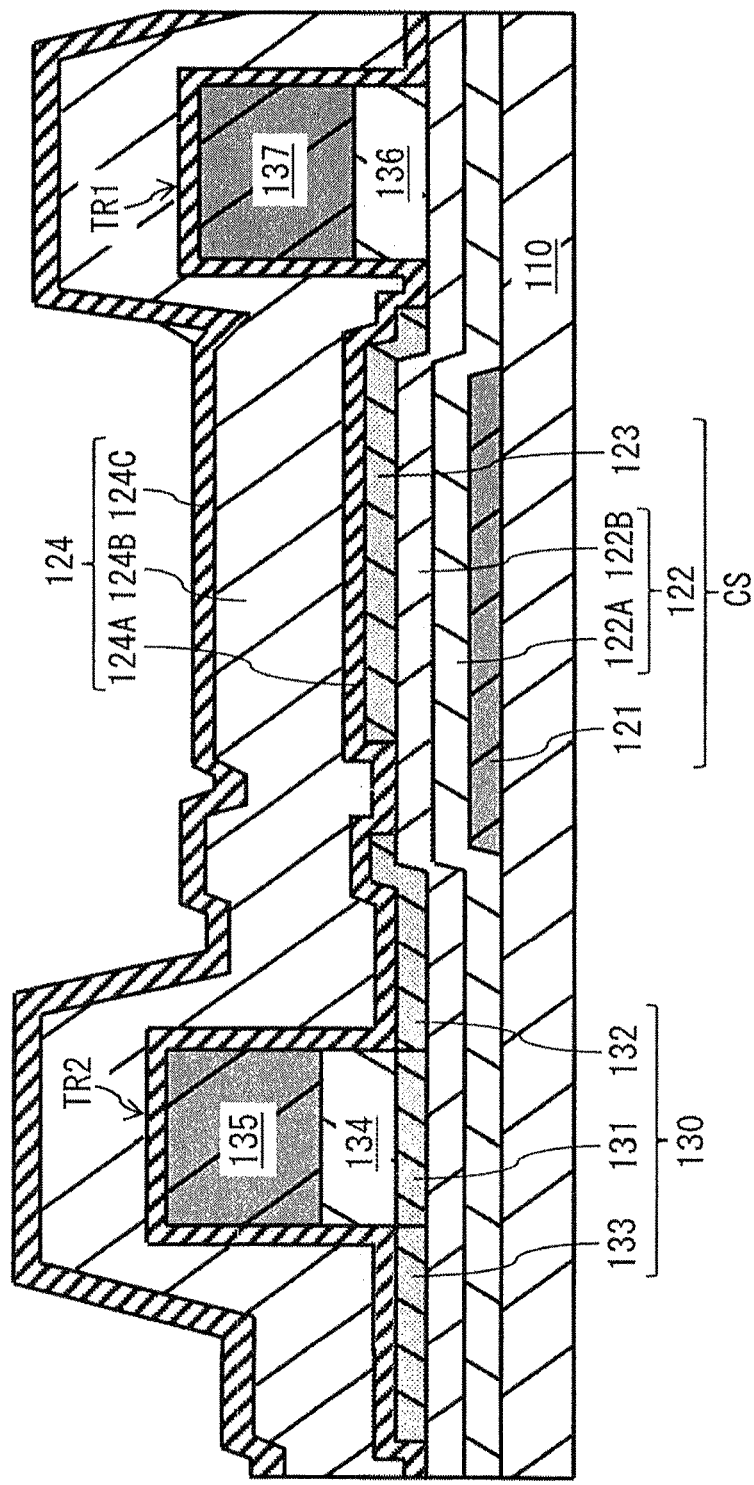
FIG. 5L is a schematic cross-sectional view of a TFT substrate according to one example embodiment of the technology for illustration of an example process following the process illustrated in FIG. 5K.
Figure 5M:
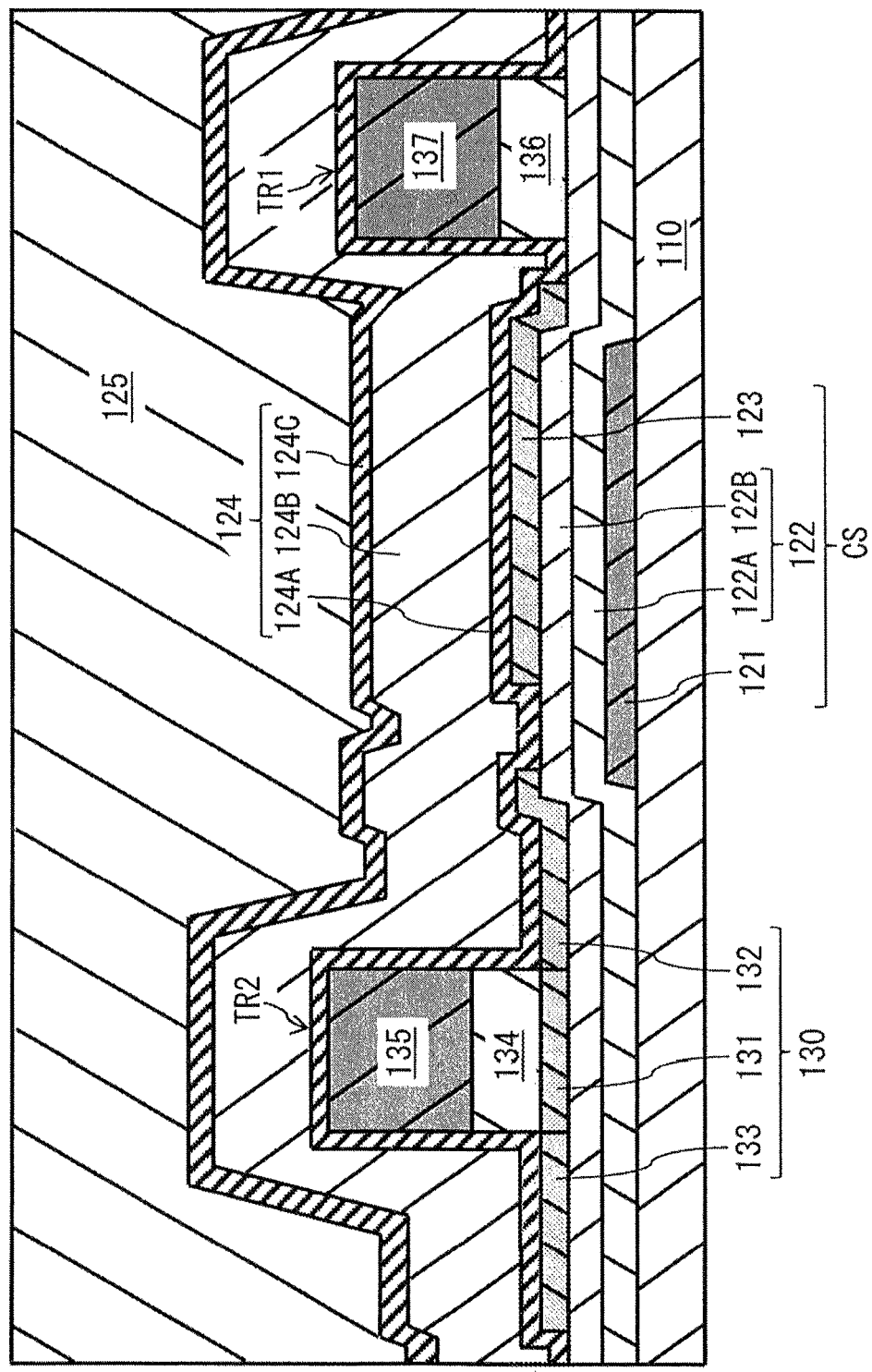
FIG. 5M is a schematic cross-sectional view of a TFT substrate according to one example embodiment of the technology for illustration of an example process following the process illustrated in FIG. 5L.
Figure 5N:
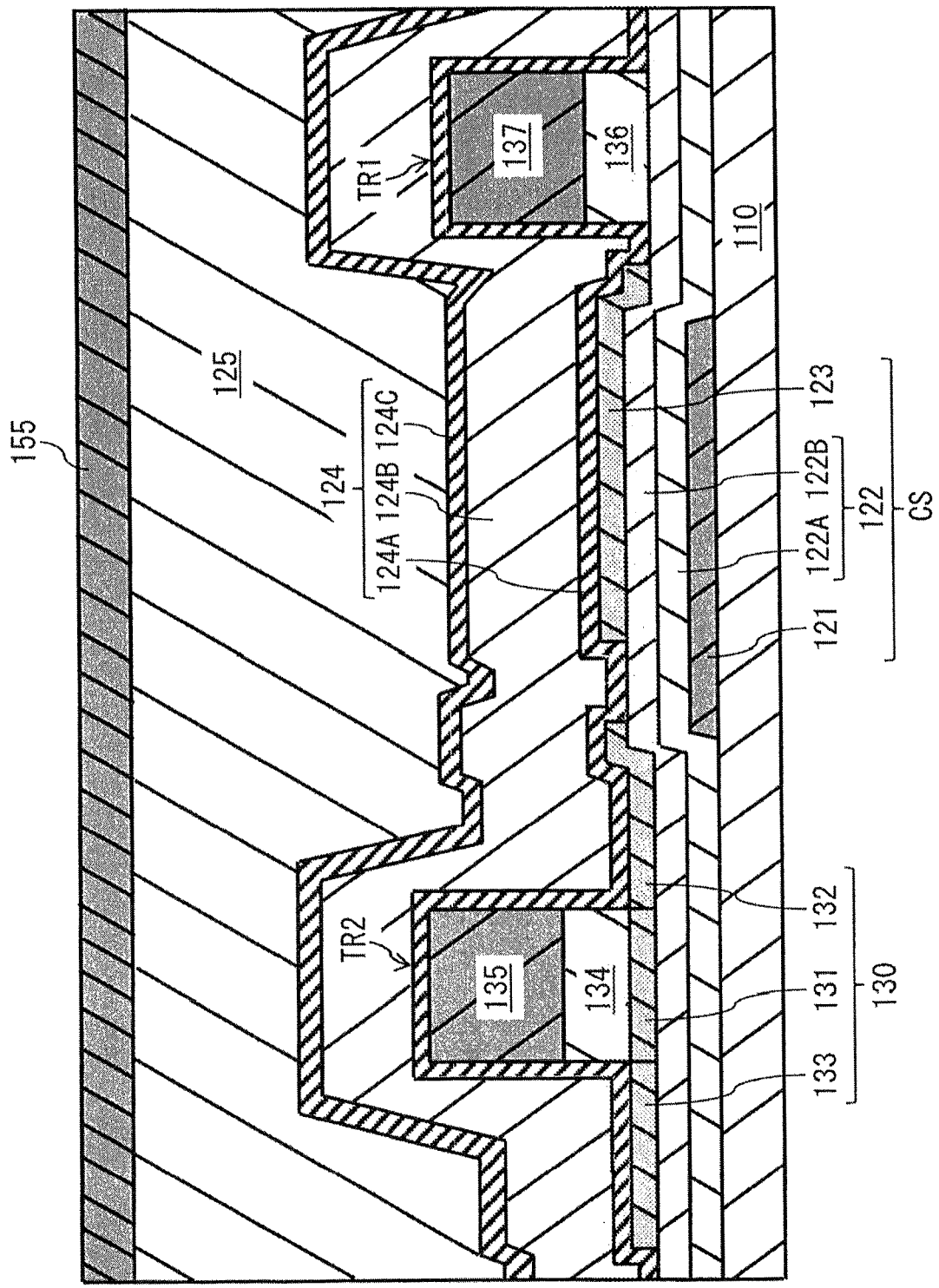
FIG. 5N is a schematic cross-sectional view of a TFT substrate according to one example embodiment of the technology for illustration of an example process following the process illustrated in FIG. 5M.
Figure 50:
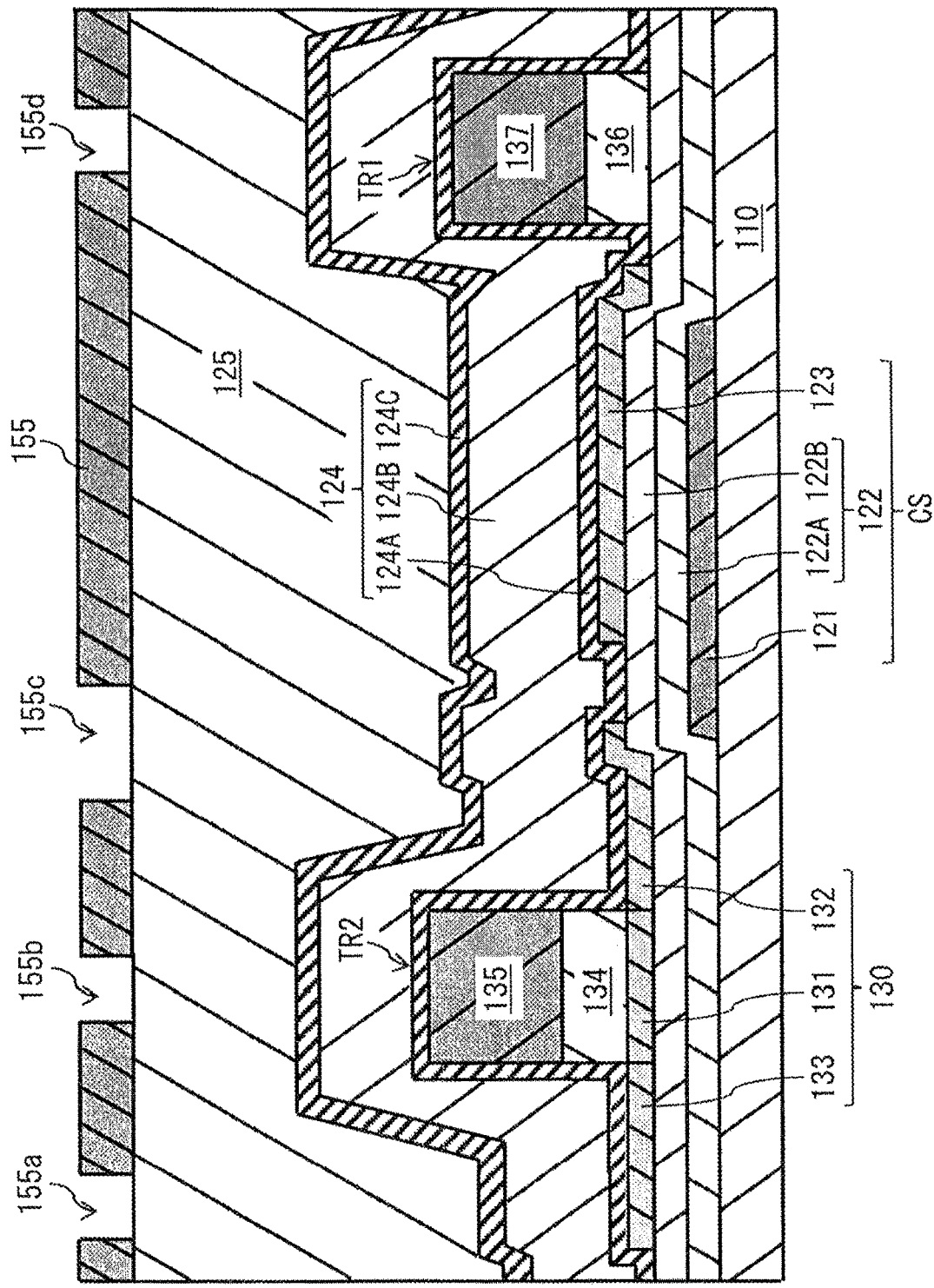
Figure 5P:
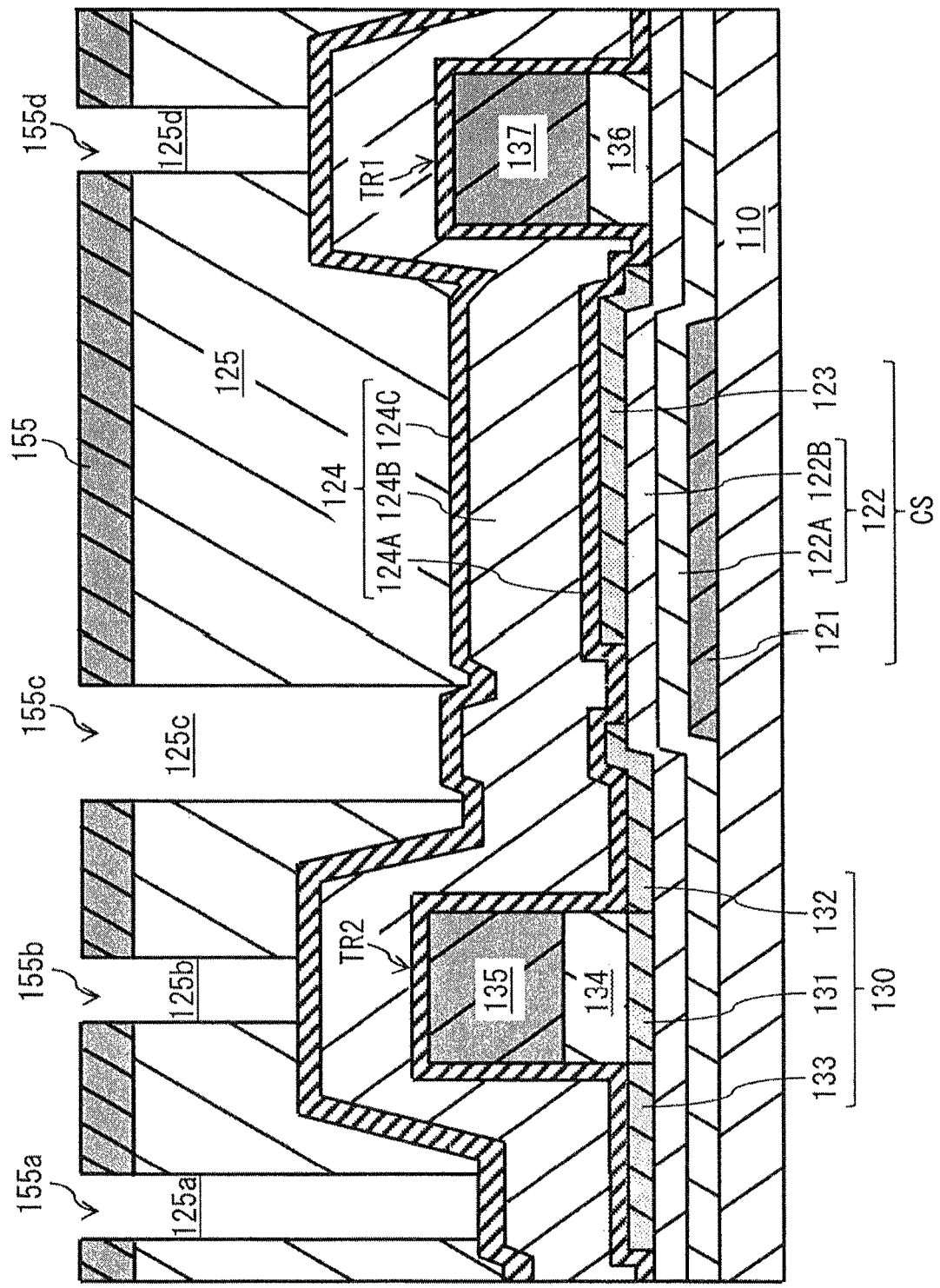
FIG. 5P is a schematic cross-sectional view of a TFT substrate according to one example embodiment of the technology for illustration of an example process following the process illustrated in FIG. 5O.
Figure 5Q:
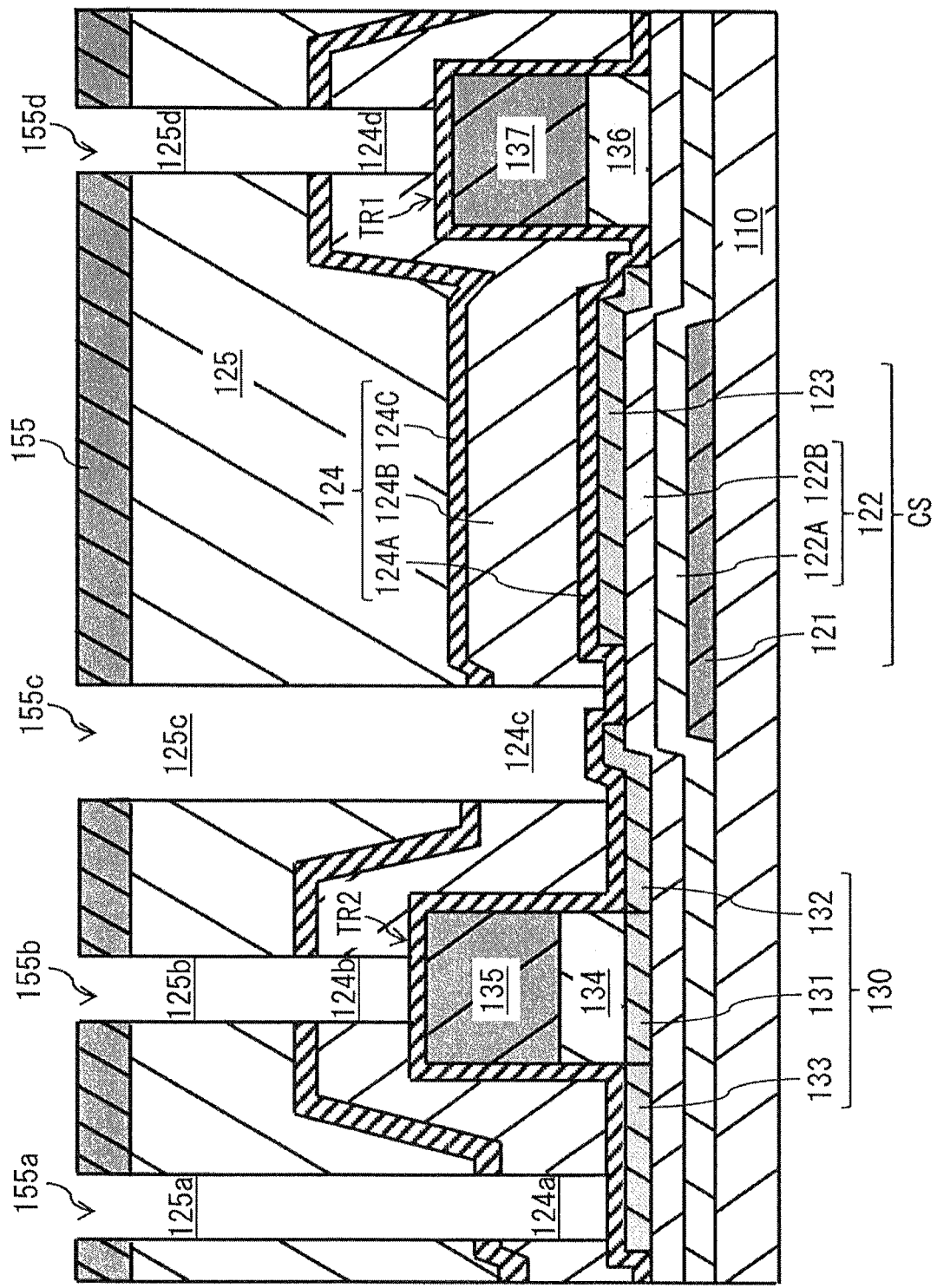
FIG. 5Q is a schematic cross-sectional view of a TFT substrate according to one example embodiment of the technology for illustration of an example process following the process illustrated in FIG. 5P.
Figure 5R:
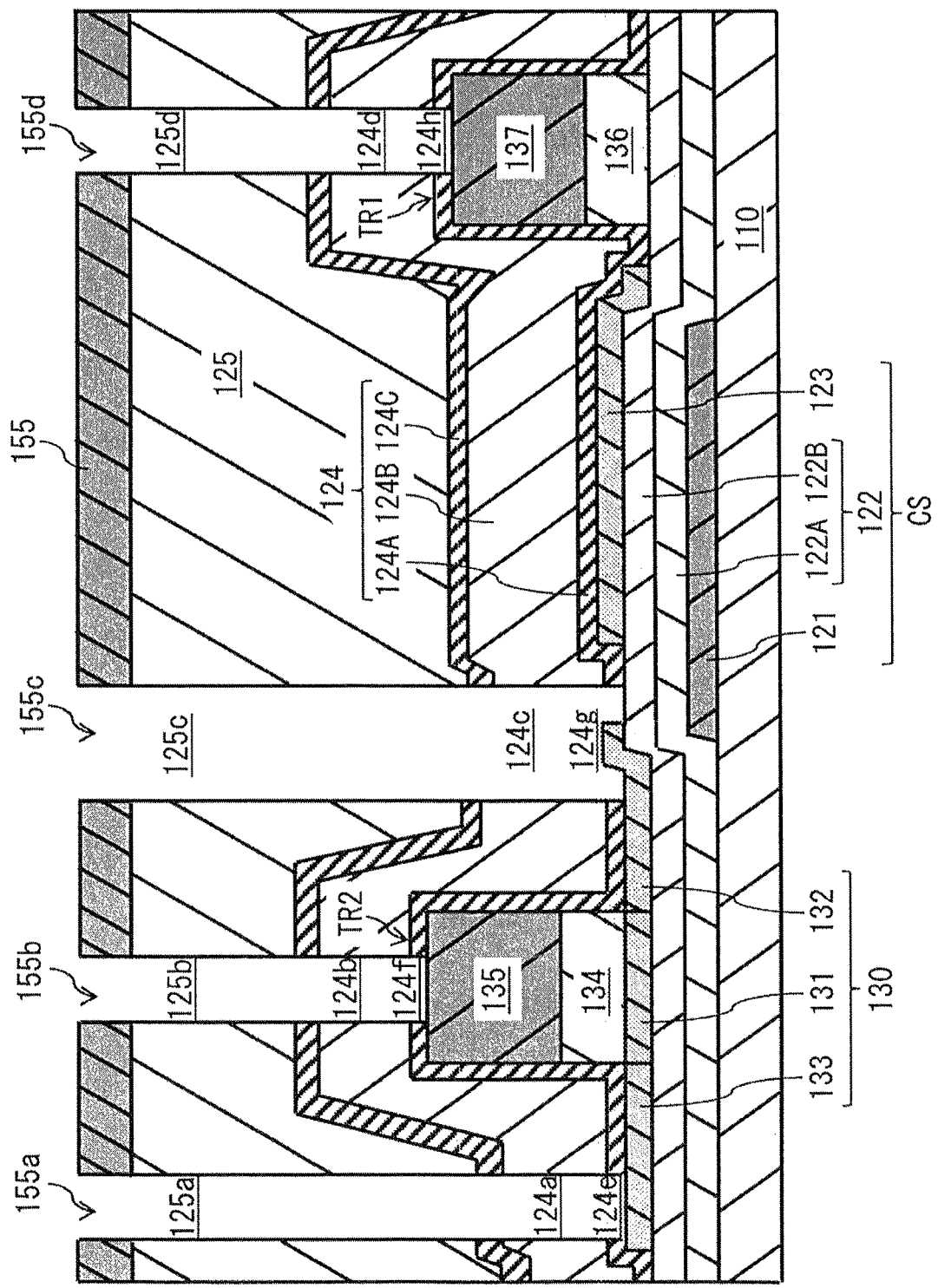
FIG. 5R is a schematic cross-sectional view of a TFT substrate according to one example embodiment of the technology for illustration of an example process following the process illustrated in FIG. 5Q.
Figure 5S:
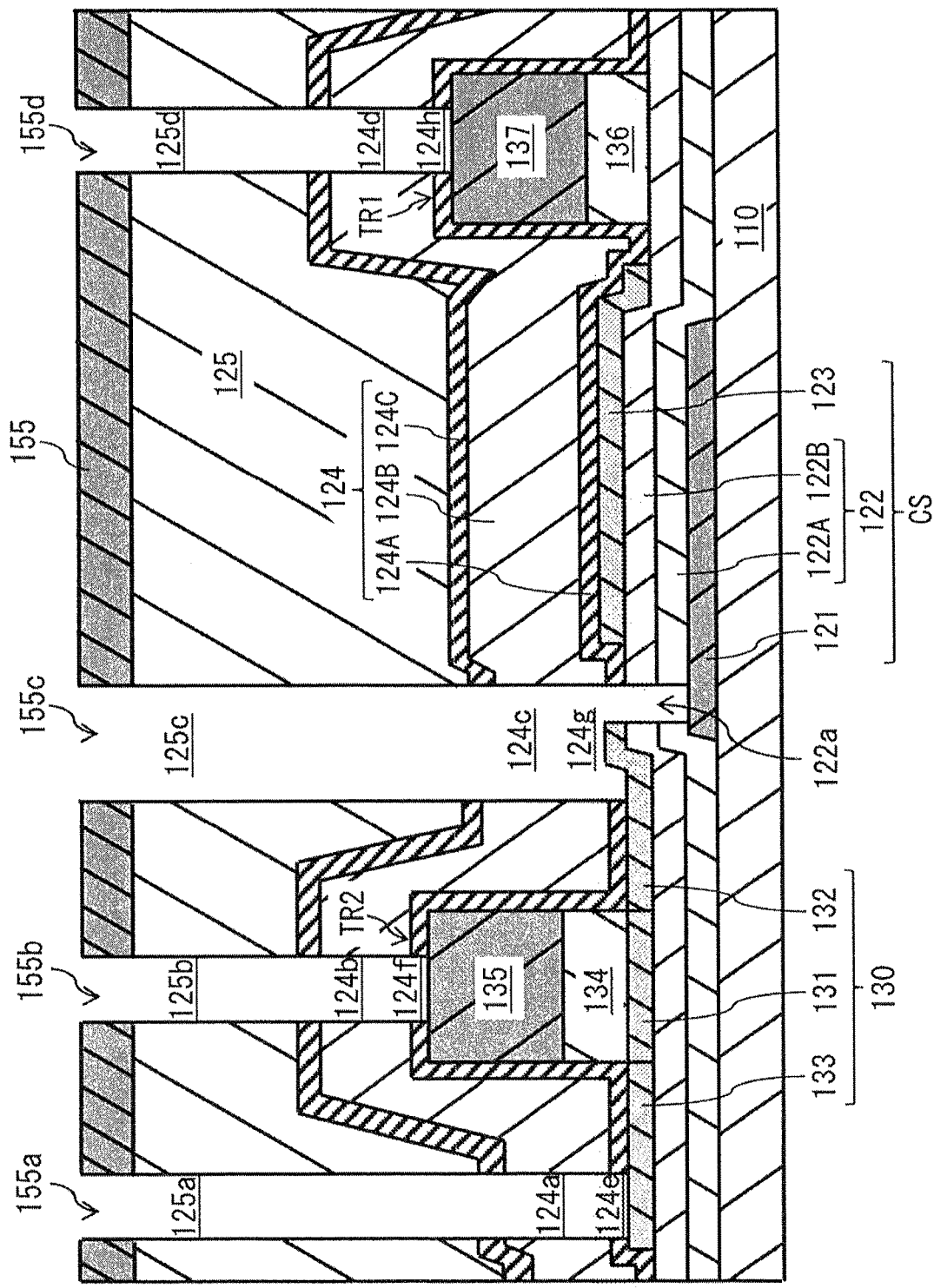
FIG. 5S is a schematic cross-sectional view of a TFT substrate according to one example embodiment of the technology for illustration of an example process following the process illustrated in FIG. 5R.

The gate electrode 141, the source electrode 142, and the drain electrode 143 may be electrically coupled to the pixel circuit 11-1 via contact holes 125a to 125d and 124a to 124h, as illustrated in FIG. 5S. The contact holes 125a to 125d and 124a to 124h may correspond to specific but non-limiting examples of "contact holes" according to one embodiment of the technology. In a specific but non-limiting example, the gate electrode 141 may be electrically coupled to the gate electrode 135 via the contact holes 125b, 124b, and 124f. The source electrode 142 may be electrically coupled to the source region 132 via the contact holes 125c, 124c, and 124g. The drain electrode 143 may be electrically coupled to the drain region 133 via the contact holes 125a, 124a, and 124e. A drain electrode 144 may be electrically coupled to a gate wiring line 137 via the contact holes 125d, 124d, and 124h.

The gate electrode 141 may be provided in contact with the gate electrode 135. The source electrode 142 may be provided in contact with the source region 132. The drain electrode 143 may be provided in contact with the drain region 133. The drain electrode 144 may be provided in contact with the gate wiring line 137. The gate electrode 141, the source electrode 142, the drain electrode 143, and the drain electrode 144 may each include an electrically-conductive material or a metal alloy of the electrically-conductive material. The gate electrode 141, the source electrode 142, the drain electrode 143, and the drain electrode 144 may each have a single-layer structure or a multilayer structure, for example. Non-limiting example materials for the gate electrode 141, the source electrode 142, the drain electrode 143, and the drain electrode 144 may include aluminum (Al), molybdenum (Mo), tungsten (W), molybdenum tungsten (MoW), copper (Cu), titanium (Ti), and chromium (Cr).

The driving transistor TR1 may include a non-illustrated oxide semiconductor layer, a gate insulating layer 136, and the gate wiring line 137, for example. The driving transistor TR1 may be coupled with a non-illustrated gate electrode, a non-illustrated source electrode, and the drain electrode 144. The gate electrode, the source electrode, and the drain electrode 144 may correspond to specific but non-limiting examples of "electrodes" according to one embodiment of the technology.

The oxide semiconductor layer provided in the driving transistor TR1 may include a material commonly included in the oxide semiconductor layer 130. The gate insulating layer 136 may include a material commonly included in the gate insulating layer 134. The gate wiring line 137 may include a material commonly included in the gate electrode 135. The gate electrode, the source electrode, and the drain electrode 144 provided in the driving transistor TR1 may each include a material commonly included in each of the gate electrode 141, the source electrode 142 and the drain electrode 143, for example.

The storage capacitor CS may include a CS lower electrode 121, the CS insulating layer 122, and a CS upper electrode 123, for example.

The CS lower electrode 121 may include an electrically-conductive material, as a main component. In a specific but non-limiting example embodiment, the electrically-conductive material may be titanium (Ti) or aluminum (Al), for example. In another example embodiment, the electrically-conductive material may include a metal of one of molybdenum (Mo), copper (Cu), tungsten (W), manganese (Mn), chromium (Cr), tantalum (Ta), niobium (Nb), silver (Ag), gold (Au), platinum (Pt), palladium (Pd), indium (In), nickel (Ni), and neodymium (Nd), or a metal alloy of two or more thereof, such as molybdenum tungsten (MoW).

The CS insulating layer 122 may be an inorganic layer provided on the substrate 110, for example, and may serve as an undercoat layer. With the CS insulating layer 122 provided to serve as an undercoat layer, it is possible to suppress impurities, such as sodium (Na) and phosphorus (P), included in the substrate 110 or moisture in atmosphere, for example, from entering into the oxide semiconductor layer 130. This allows the oxide semiconductor layer 130 to have stable film quality, making it possible to stabilize TFT properties. The CS insulating layer 122 may have a multilayer structure including a CS insulating film 122A including a silicon nitride film (SiNx) and a CS insulating film 122B including a silicon oxide film (SiOx), for example. The CS insulating layer 122 may have a film thickness in a range from 100 nm to 1000 nm, for example.

The CS upper electrode 123 may include, as a main component, an oxide semiconductor material having undergone processing to have electrical conductivity. In the example embodiment, the CS upper electrode 123 may be provided in the same layer as the oxide semiconductor layer 130, and may include a material the same as the material of the oxide semiconductor layer 130. The CS upper electrode 123 may have a film thickness the same as the film thickness of the oxide semiconductor layer 130. That is, the film thickness is in a range from 10 nm to 300 nm, for example.

The CS upper electrode 123 may include a film-formed, transparent amorphous oxide semiconductor having undergone processing to have electrical conductivity to serve as a conductor, for example. To allow an oxide semiconductor to have undergone processing to have electrical conductivity, as well as to have low resistivity, oxygen deficiency may be caused to occur on the oxide semiconductor, similar to the case of forming the source region 132 and the drain region 133.

The TFT substrate 13 may further include, for example, an inorganic insulating film 124 and an organic insulating film 125 both covering the pixel circuits 11-1. The inorganic insulating film 124 may correspond to a specific but non-limiting example of an "inorganic insulating film" according to one embodiment of the technology. The organic insulating film 125 may correspond to a specific but non-limiting example of an "organic insulating film" according to one embodiment of the technology. The inorganic insulating film 124 and the organic insulating film 125 may correspond to specific but non-limiting examples of "interlayer insulating films" according to one embodiment of the technology. The TFT substrate 13 may be covered with a laminate including the inorganic insulating film 124 and the organic insulating film 125, for example. The inorganic insulating film 124 and the organic insulating film 125 may be provided to cover the driving transistor TR1, the switching transistor TR2, and the storage capacitor CS. The inorganic insulating film 124 may be provided in contact with surfaces of the driving transistor TR1, the switching transistor TR2, and the storage capacitor CS.

The inorganic insulating film 124 may be provided to suppress hydrogen from passing therethrough. The inorganic insulating film 124 may be a three-layered film of a lower inorganic film 124A, an intermediate inorganic film 124B, and an upper inorganic film 124C laminated in order from the substrate 110, for example. The inorganic insulating film 124 may be provided in contact with the surfaces of the driving transistor TR1 and the switching transistor TR2.

The lower inorganic film 124A may serve as a hydrogen inhibition layer or a hydrogen block layer that suppresses hydrogen from passing therethrough. The lower inorganic film 124A may suppress hydrogen included in the intermediate inorganic film 124B from being supplied to the channel region 131. The lower inorganic film 124A may suppress hydrogen included in the substrate 110 from being supplied to the intermediate inorganic film 124B, for example.

The lower inorganic film 124A may be provided to cover surfaces of the gate electrode 135, the source region 132, the drain region 133, the CS upper electrode 123, and the CS insulating film 122. In a specific but non-limiting example, the lower inorganic film 124A may be provided in contact with the surfaces of the gate electrode 135, the source region 132, the drain region 133, the CS upper electrode 123, and the CS insulating film 122.

In an example embodiment, the lower inorganic film 124A may have a film thickness that sufficiently allows oxygen to exit from the oxide semiconductor layer 130 and the CS upper electrode 123. The film thickness of the lower inorganic film 124A may be 10 nm or greater, for example. In another example embodiment, the film thickness of the lower inorganic film 124A may be 20 nm or greater, for example. The lower inorganic film 124A may have a film density of 2.7 $g/cm^3$ or smaller, for example. The lower inorganic film 124A may include aluminum oxide, for example.

The intermediate inorganic film 124B may be provided to cover the lower inorganic film 124A. In a specific but non-limiting example embodiment, the intermediate inorganic film 124B may be provided to cover an entire top surface of an element region provided with the pixel circuit 11-1. The intermediate inorganic film 124B may have a film thickness of, for example but not limited to, 200 nm. The intermediate inorganic film 124B may include a material including an inorganic substance, as a main component. The intermediate inorganic film 124B may be a single-layer film of one of a silicon oxide film (SiOx), a silicon nitride film (SiNx), a silicon oxide nitride film (SiONx), and an aluminum oxide film (AlOx), or a multilayer film of two or more thereof, for example. In this case, a material having a smaller relative dielectric constant may be used to form the intermediate inorganic film 124B at any film thickness. This makes it possible to reduce parasitic capacitance between the gate electrode 135 and the source electrode 142 or the drain electrode 143.

The upper inorganic film 124C may serve as an example hydrogen inhibition layer or a hydrogen block layer that suppresses hydrogen from passing therethrough. The upper inorganic film 124C may suppress hydrogen included in the organic insulating film 125 from being supplied to the intermediate inorganic film 124B.

The upper inorganic film 124C may be provided to cover the intermediate inorganic film 124B. In a specific but non-limiting example embodiment, the upper inorganic film 124C may be provided to cover the entire top surface of the element region provided with the pixel circuit 11-1. The upper inorganic film 124C may have a film thickness of, for example but not limited to, 10 nm or greater. The upper inorganic film 124C may include aluminum oxide, for example.

The organic insulating film 125 may be provided on the inorganic insulating film 124. The organic insulating film 125 may include an organic material, such as polyimide, for example. The organic insulating film 125 may be a single-layer film or a multilayer film.

The inorganic insulating film 124 and the organic insulating film 125 may respectively have pluralities of opening portions. The pluralities of opening portions may respectively serve as the contact holes 125a to 125d and 124a to 124h. The pluralities of opening portions may respectively extend through the inorganic insulating film 124 and the organic insulating film 125 as illustrated in FIG. 5S. Via some of the opening portions, the gate electrode 141 and the gate electrode 135 may be coupled with each other. Via some of the opening portions, the source electrode 142 and the source region 132 may be coupled with each other. Via some of the opening portions, the drain electrode 143 and the drain region 133 may be coupled with each other. Via some of the opening portions, the drain electrode 144 and the gate wiring line 137 may be coupled with each other. The contact holes 125a to 125c, 124a to 124c, and 124e to 124g may be provided above the switching transistor TR2. The contact holes 125d, 124d, and 124h may be provided above the driving transistor TR1. The contact holes 125c, 124c, and 124g may be provided above a region including a boundary between the switching transistor TR2 and the storage capacitor CS.

An upper portion of the gate electrode 141 may be exposed above a surface of the organic insulating film 125, and may be coupled to each of the scanning lines WSL. An upper portion of the source electrode 142 may be exposed above the surface of the organic insulating film 125, and may be coupled to the gate of the driving transistor TR1. An upper portion of the drain electrode 143 may be exposed above the surface of the organic insulating film 125, and may be coupled to each of the signal lines DTL. An upper portion of the drain electrode 144 may be exposed above the surface of the organic insulating film 125, and may be coupled to each of the power lines DSL.

The TFT substrate 13 further includes a hard mask metal 140 at gaps between the surface of the organic insulating film 125 and portions exposed above the surface of the organic insulating film 125 from the electrodes including the gate electrode 141, the source electrode 142, the drain electrode 143, and the drain electrode 144, for example. The hard mask metal 140 may correspond to a specific but non-limiting example of a "hard mask metal" according to one embodiment of the technology. The hard mask metal 140 may have openings 155a to 155d at respective portions facing the contact holes 125a to 125d and 124a to 124h, as illustrated in FIG. 5S, provided on the inorganic insulating film 124 and the organic insulating film 125. The hard mask metal 140 may be provided on the surface of the organic insulating film 125. The hard mask metal 140 may correspond to portions of a hard mask metal 155 described later used to provide the contact holes 125a to 125d and 124a to 124h respectively on the inorganic insulating film 124 and the organic insulating film 125 in a process of manufacturing the TFT substrate 13. The hard mask metal 140 may include one or more of Cu, Co, W, AlOx, AlN, AlOxNy, WOx, Ti, TiN, ZrOx, HfOx, and TaOx, for example.

[Manufacturing Method]

Figure 5T:
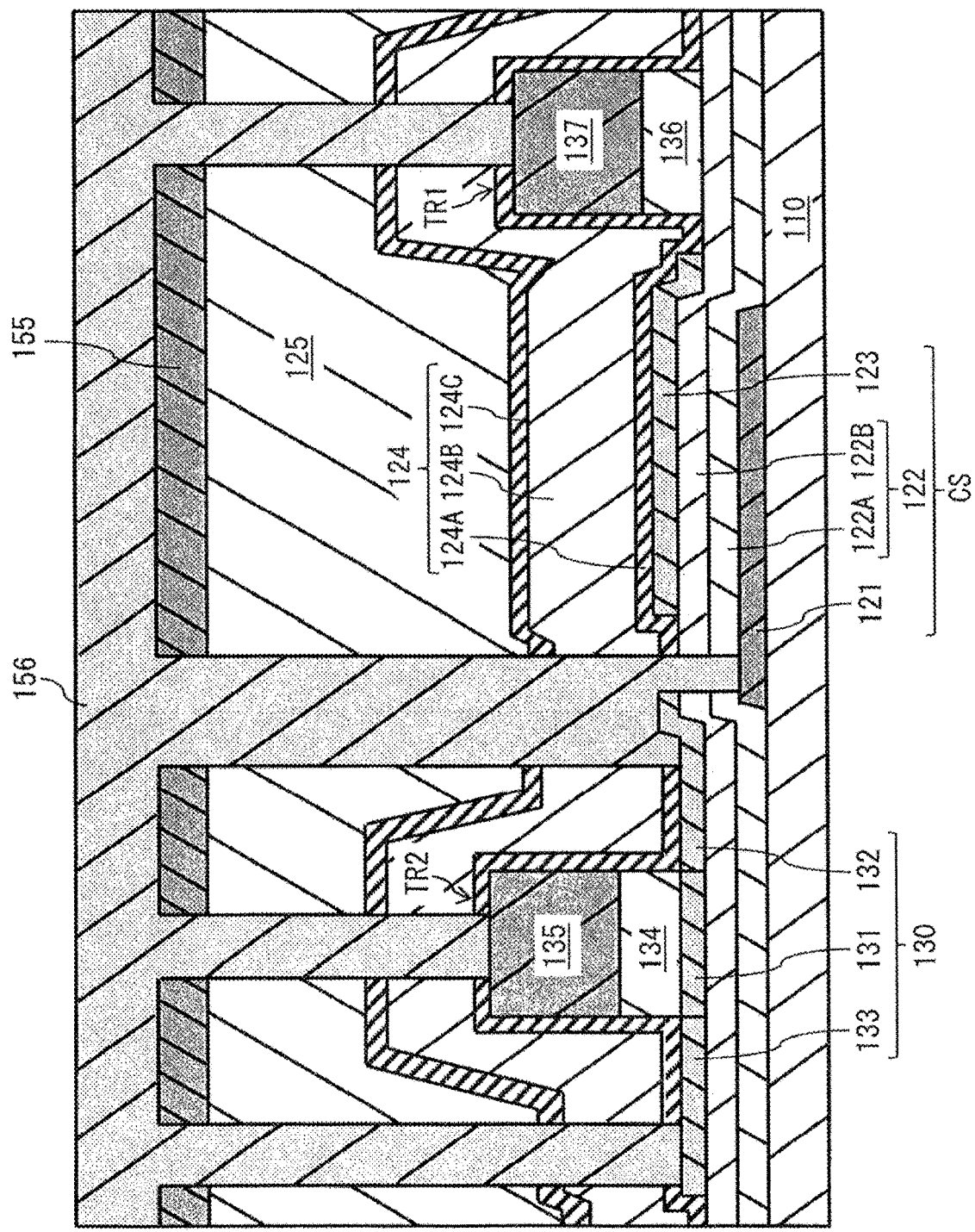
FIG. 5T is a schematic cross-sectional view of a TFT substrate according to one example embodiment of the technology for illustration of an example process following the process illustrated in FIG. 5S.

Next, a method for manufacturing the TFT substrate 13 according to an example embodiment will now be described with reference to FIGS. 5A to 5T. FIGS. 5A to 5T illustrate a series of processing from preparing the substrate 110 to immediately before forming the electrodes including the gate electrode 141, the source electrode 142, the drain electrode 143, and the drain electrode 144.

First, the substrate 110 may be prepared, as illustrated in FIG. 5A. A surface of the substrate 110 may be at this time cleaned if necessary, for example. Next, sputtering may be performed, for example, to form the CS lower electrode 121 on the entire surface of the substrate 110, as illustrated in FIG. 5B. Thereafter, a first mask having a predetermined pattern may be formed on the CS lower electrode 121. Dry-etching may then be performed to selectively remove the CS lower electrode 121, as illustrated in FIG. 5C. The mask may then be removed.

Next, chemical vapor deposition (CVD) may be performed, for example, to form the CS insulating film 122 on the entire surface including the CS lower electrode 121, as illustrated in FIG. 5D. Thereafter, sputtering may be performed, for example, to form an oxide semiconductor layer 151 on the CS insulating film 122, as illustrated in FIG. 5E. Thereafter, a second mask having a predetermined pattern may be formed on the oxide semiconductor layer 151. Wet-etching may then be performed to selectively remove the oxide semiconductor layer 151. Annealing may be performed on the remained portions of the oxide semiconductor layer 151 after the selective removal. The oxide semiconductor layer 130 and the CS upper electrodes 123 may thus be formed. The storage capacitor CS may be formed as well, as illustrated in FIG. 5F. The mask may then be removed.

Next, CVD may be performed, for example, to form a gate insulating film 152 on the entire surface including the oxide semiconductor layer 130 and the CS upper electrode 123, as illustrated in FIG. 5G. The gate insulating film 152 may be an insulating film to be processed into the gate insulating films 134 and 136 in a later process. Thereafter, sputtering may be performed, for example, to form a gate electrode 153 on the gate insulating film 152, as illustrated in FIG. 5H. The gate electrode 153 may be a metal layer to be processed into the gate electrodes 135 and 137 in a later process. Thereafter, a third mask having a predetermined pattern may be formed on the gate electrode 153. Dry-etching may then be performed to selectively remove the gate electrode 153 and the gate insulating film 152. The driving transistor TR1 and the switching transistor TR2 may thus be formed, as illustrated in FIG. 5I. The mask may then be removed.

Next, sputtering may be performed, for example, to form the lower inorganic film 124A. CVD may be performed, for example, to further form the intermediate inorganic film 124B. Sputtering may be performed, for example, to further form the upper inorganic film 124C, as illustrated in FIGS. 5J, 5K, and 5L. The inorganic film 124 may thus be formed. Next, the organic insulating film 125 may be formed by coating, for example. Annealing may then be performed, for example, to allow the organic insulating film 125 to be solidified, as illustrated in FIG. 5M.

Next, sputtering may be performed, for example, to form the hard mask metal 155 on the organic insulating film 125, as illustrated in FIG. 5N. Patterning may then be performed, as a fourth mask, for example, to form the openings 155a, 155b, 155c, and 155d at predetermined portions, as illustrated in FIG. 5O. Thereafter, dry-etching may be performed, for example, to selectively remove the organic insulating film 125 via the openings 155a, 155b, 155c, and 155d of the hard mask metal 155. The contact holes 125a, 125b, 125c, and 125d may thus be formed on the organic insulating film 125, as illustrated in FIG. 5P. Thereafter, dry-etching may be performed with another etching gas to selectively remove the inorganic film 124 via the openings 155a, 155b, 155c, and 155d of the hard mask metal 155. The through-holes or contact holes 124a, 124b, 124c, 124d, 124e, 124f, 124g, and 124h may thus be formed, as illustrated in FIGS. 5Q and 5R. Thereafter, dry-etching may be performed with still another etching gas to selectively remove a portion, which is exposed at a bottom of the opening 155c, of the CS insulating film 122. A through-hole or a contact hole 122a may thus be formed on the CS insulating film 122, as illustrated in FIG. 5S.

Next, sputtering may be performed, for example, to form an electrode layer 156 on the entire surface having the contact holes, as illustrated in FIG. 5T. The electrode layer 156 may be a metal layer to be processed into the electrodes including the gate electrode 141, the source electrode 142, the drain electrode 143, and the drain electrode 144 in a later process. Thereafter, a fifth mask having a predetermined pattern may be formed on the electrode layer 156. Dry-etching may then be performed to selectively remove the electrode layer 156 and the hard mask metal 155. The hard mask metal 155 may at this time remain in gaps between the organic insulating film 125 and the remained portions of the electrode layer 156 after the selective removal. The hard mask metal 155 remained at this time may be processed into the hard mask metal 140 described above in a later process. Thereafter, annealing may be performed on the remained portions of the electrode layer 156 after the selective removal. The electrodes including the gate electrode 141, the source electrode 142, the drain electrode 143, and the drain electrode 144 may thus be formed, as illustrated in FIG. 4. As described above, the TFT substrate 13 may be manufactured.

Next, a method for manufacturing a TFT substrate 200 according to a comparative example will now be described with reference to FIGS. 6A to 6L.

An oxide semiconductor layer 130 and a CS upper electrode 123 may be formed with a method substantially common to the method for manufacturing the TFT substrate 13 according to the example embodiment described above. An undercoat may be formed between a substrate 110 and a CS lower electrode 121. In this case, the undercoat may be a laminate including a silicon nitride film (SiNx) and a silicon oxide film (SiOx) in order from the substrate 110, for example.

Figure 6A:
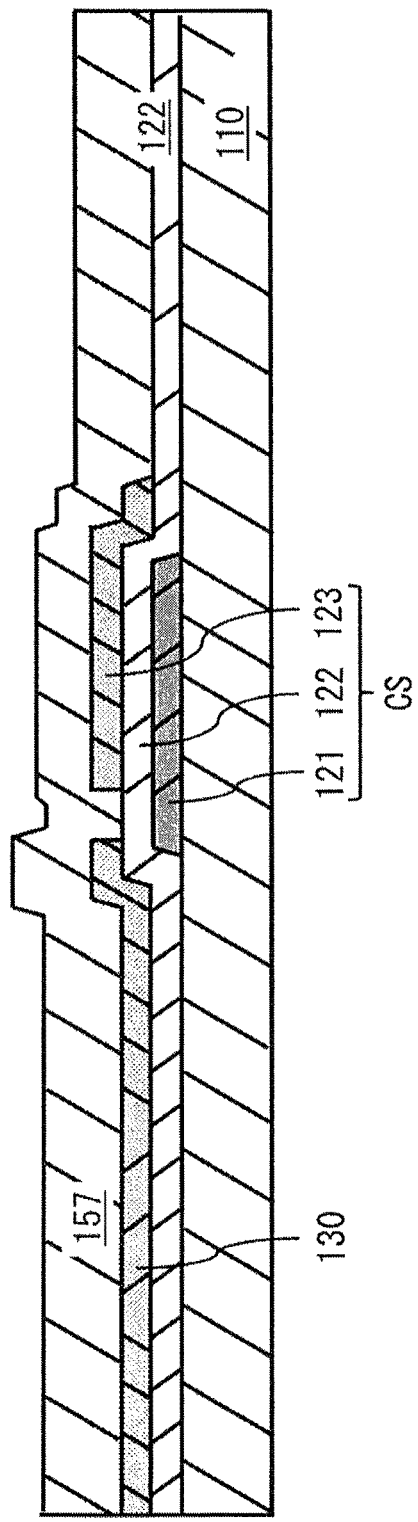
FIG. 6A is a schematic cross-sectional view of a TFT substrate according to a comparative example for illustration of an example process of a manufacturing method of the TFT substrate.
Figure 6B:
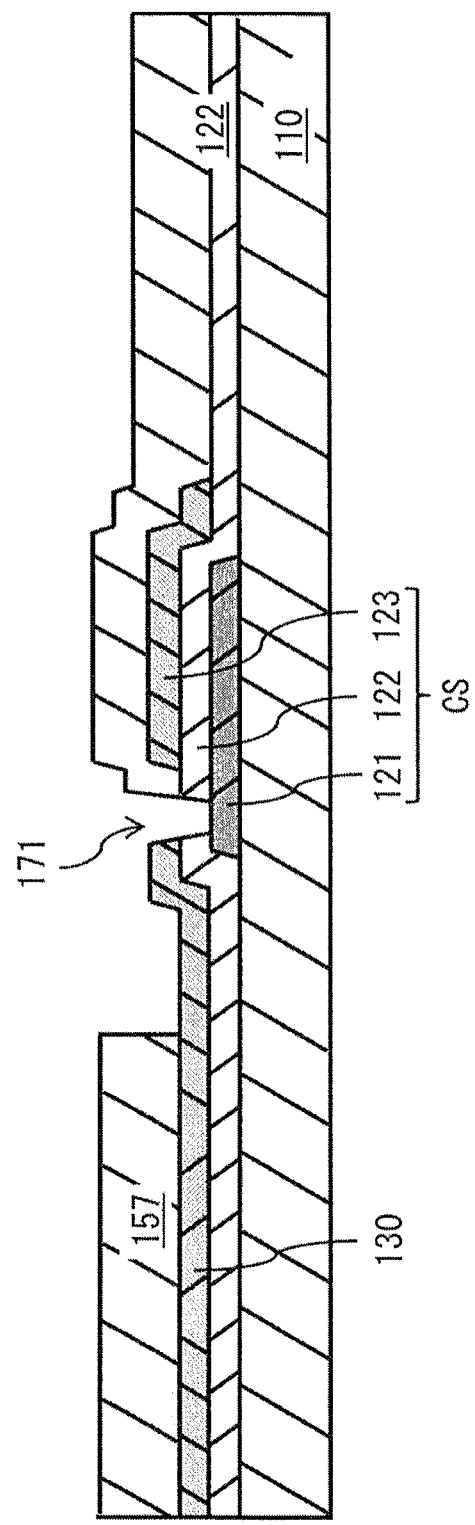
FIG. 6B is a schematic cross-sectional view of a TFT substrate according to the comparative example for illustration of an example process following the process illustrated in FIG. 6A.

First, CVD may be performed, for example, to form a gate insulating film 157 on an entire surface including the oxide semiconductor layer 130 and the CS upper electrode 123, as illustrated in FIG. 6A. The gate insulating film 157 may be processed into gate insulating films 134 and 136 in a later process. Thereafter, for example, the third mask having a predetermined pattern may be formed on the gate insulating film 157. Dry-etching may then be performed to selectively remove the gate insulating film 157 and the CS insulating film 122. A contact hole 171 extending through the gate insulating film 157 and the CS insulating film 122 may thus be formed, as illustrated in FIG. 6B.

Figure 6C:
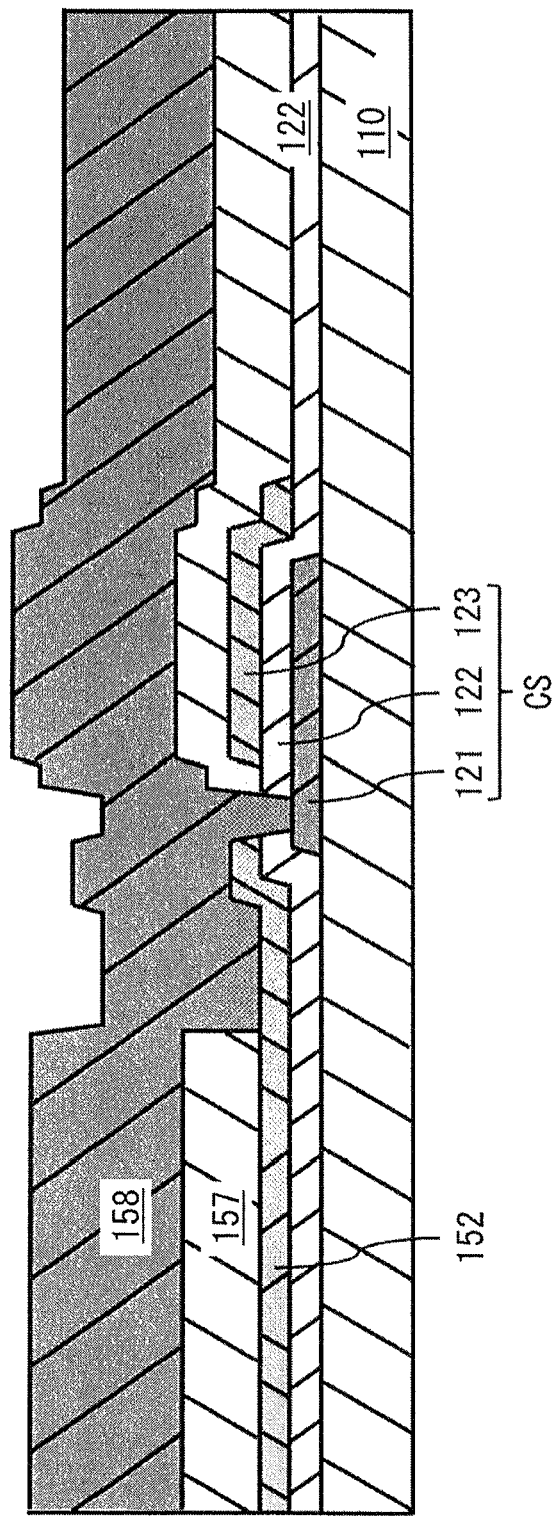
FIG. 6C is a schematic cross-sectional view of a TFT substrate according to the comparative example for illustration of an example process following the process illustrated in FIG. 6B.
Figure 6D:
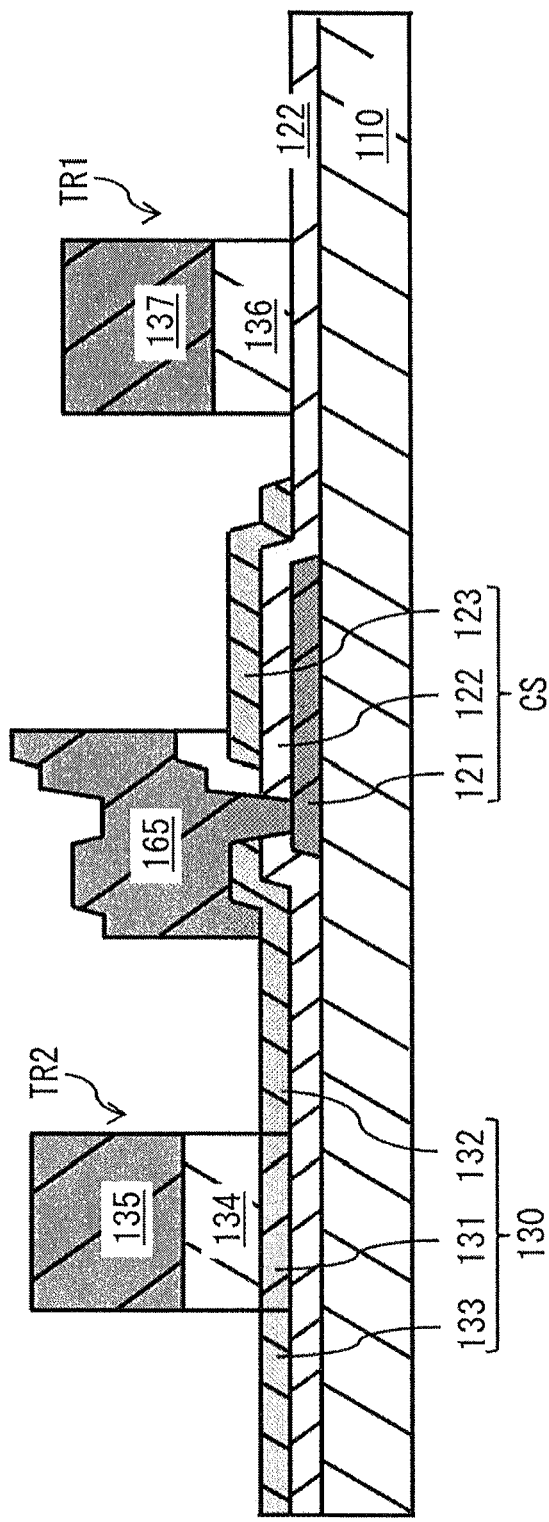
FIG. 6D is a schematic cross-sectional view of a TFT substrate according to the comparative example for illustration of an example process following the process illustrated in FIG. 6C.

Next, sputtering may be performed, for example, to form a gate electrode 158 on the entire surface including the gate insulating film 157, as illustrated in FIG. 6C. The gate electrode 158 may be a metal layer to be processed into gate electrodes 135 and 137 in a later process. Thereafter, the fourth mask having a predetermined pattern may be formed on the gate electrode 158. Dry-etching may then be performed to selectively remove the gate electrode 158 and the gate insulating film 157. The gate electrode 135, a source electrode 165, and the gate wiring line 137 may thus be formed. As a result, a driving transistor TR1 and a switching transistor TR2 may be formed, as illustrated in FIG. 6D. The mask may then be removed.

Figure 6E:
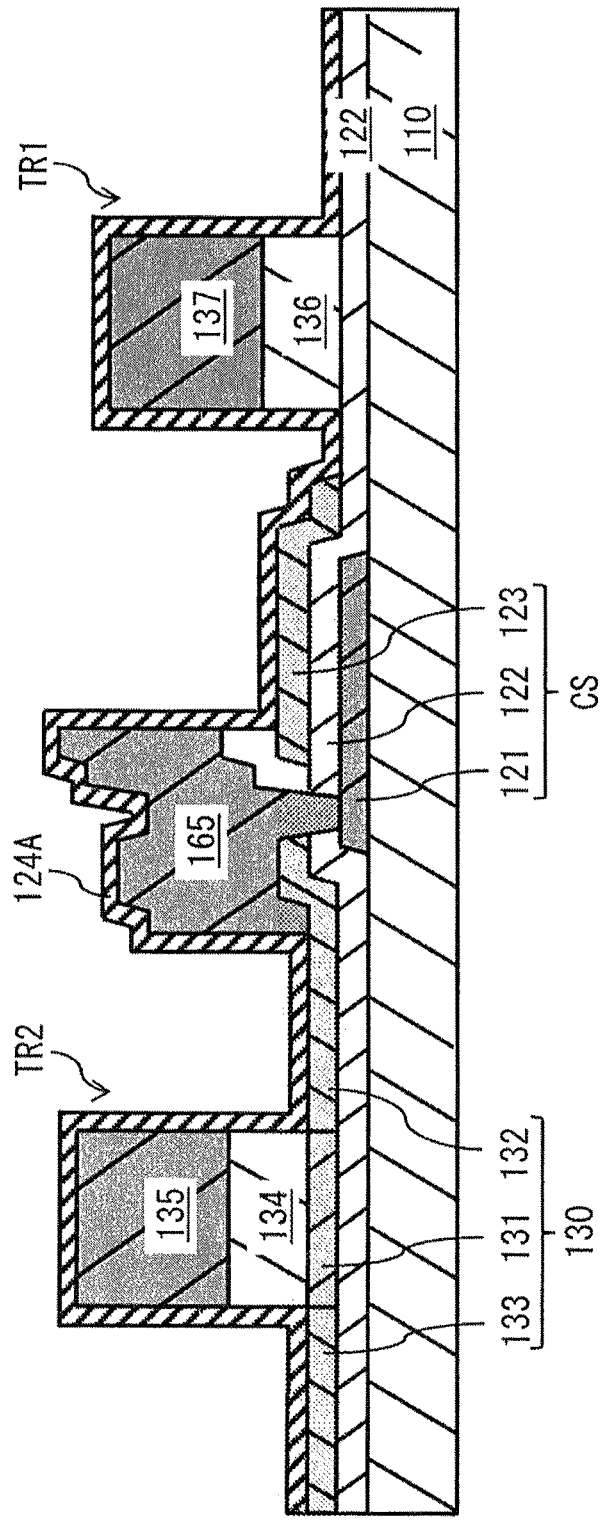
FIG. 6E is a schematic cross-sectional view of a TFT substrate according to the comparative example for illustration of an example process following the process illustrated in FIG. 6D.
Figure 6F:
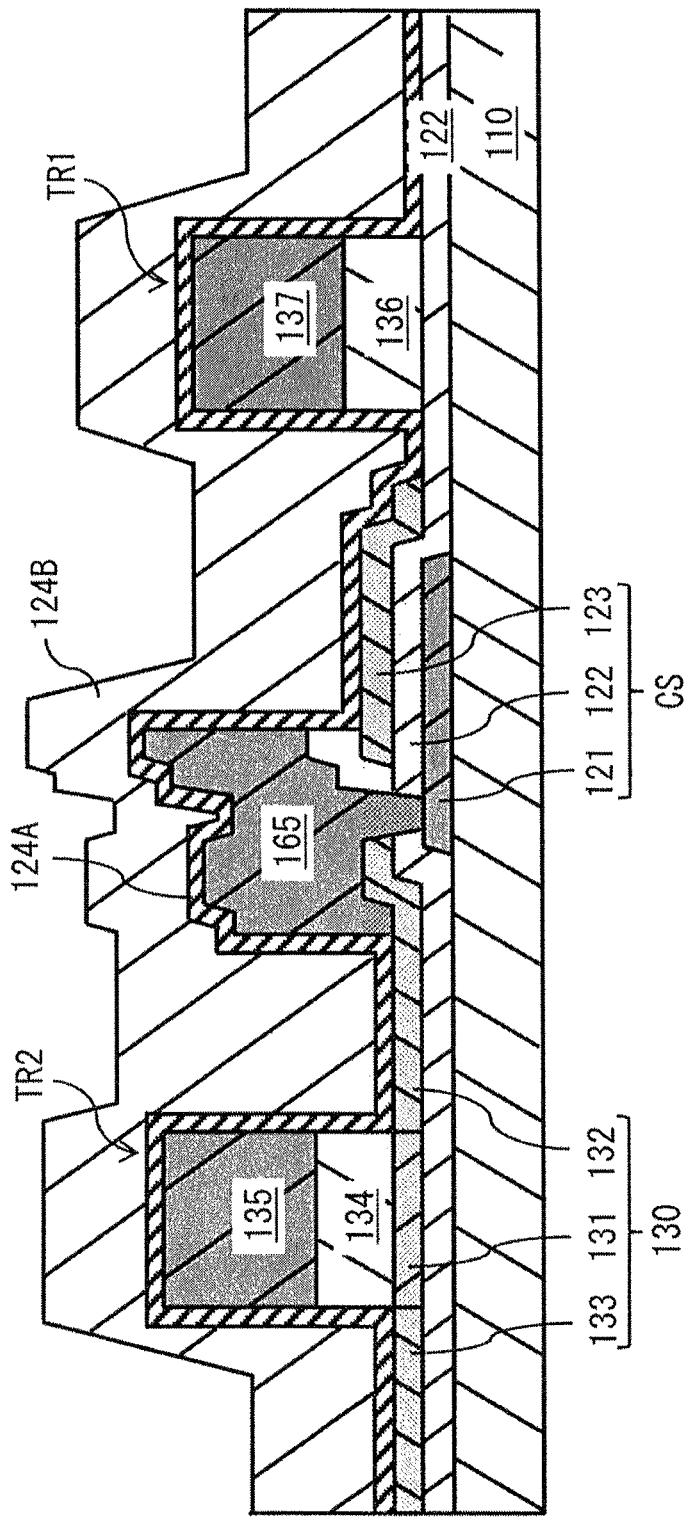
FIG. 6F is a schematic cross-sectional view of a TFT substrate according to the comparative example for illustration of an example process following the process illustrated in FIG. 6E.
Figure 6G:
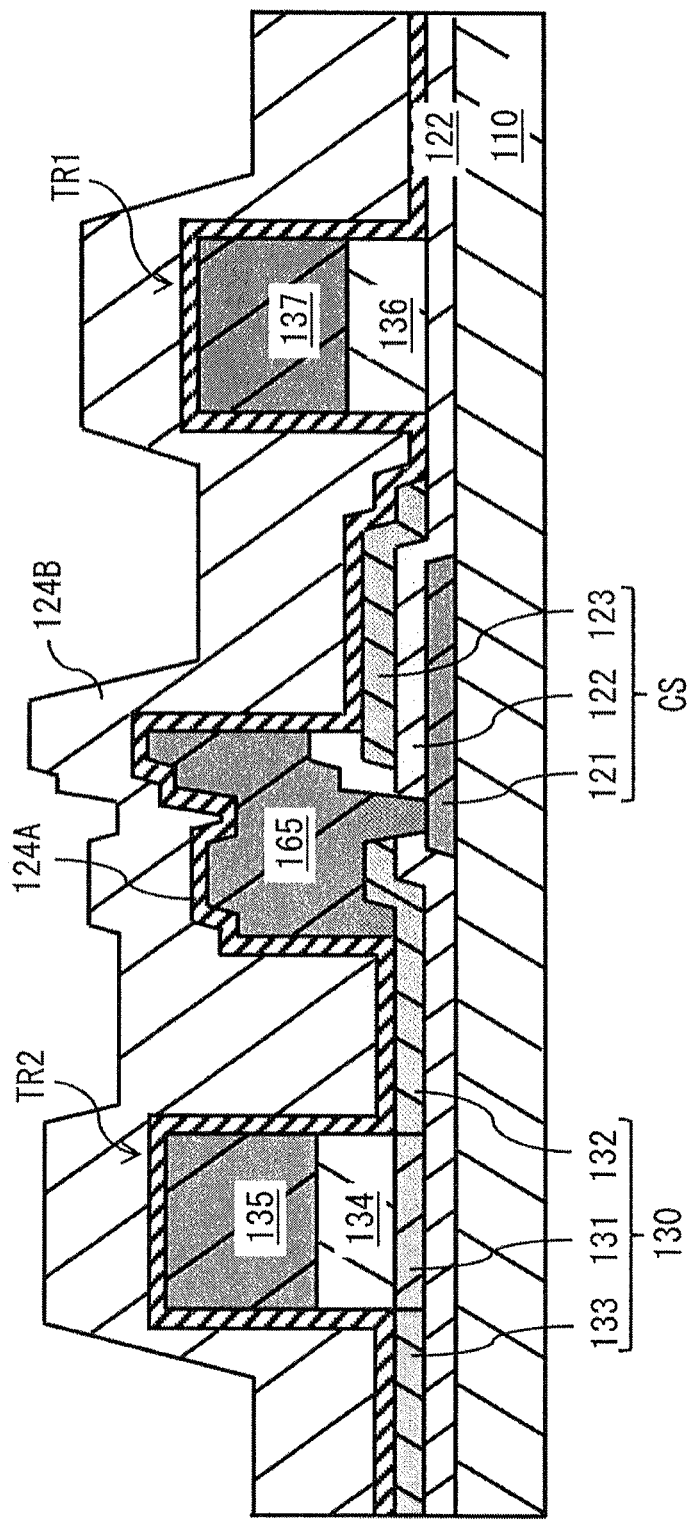
FIG. 6G is a schematic cross-sectional view of a TFT substrate according to the comparative example for illustration of an example process following the process illustrated in FIG. 6F.
Figure 6H:
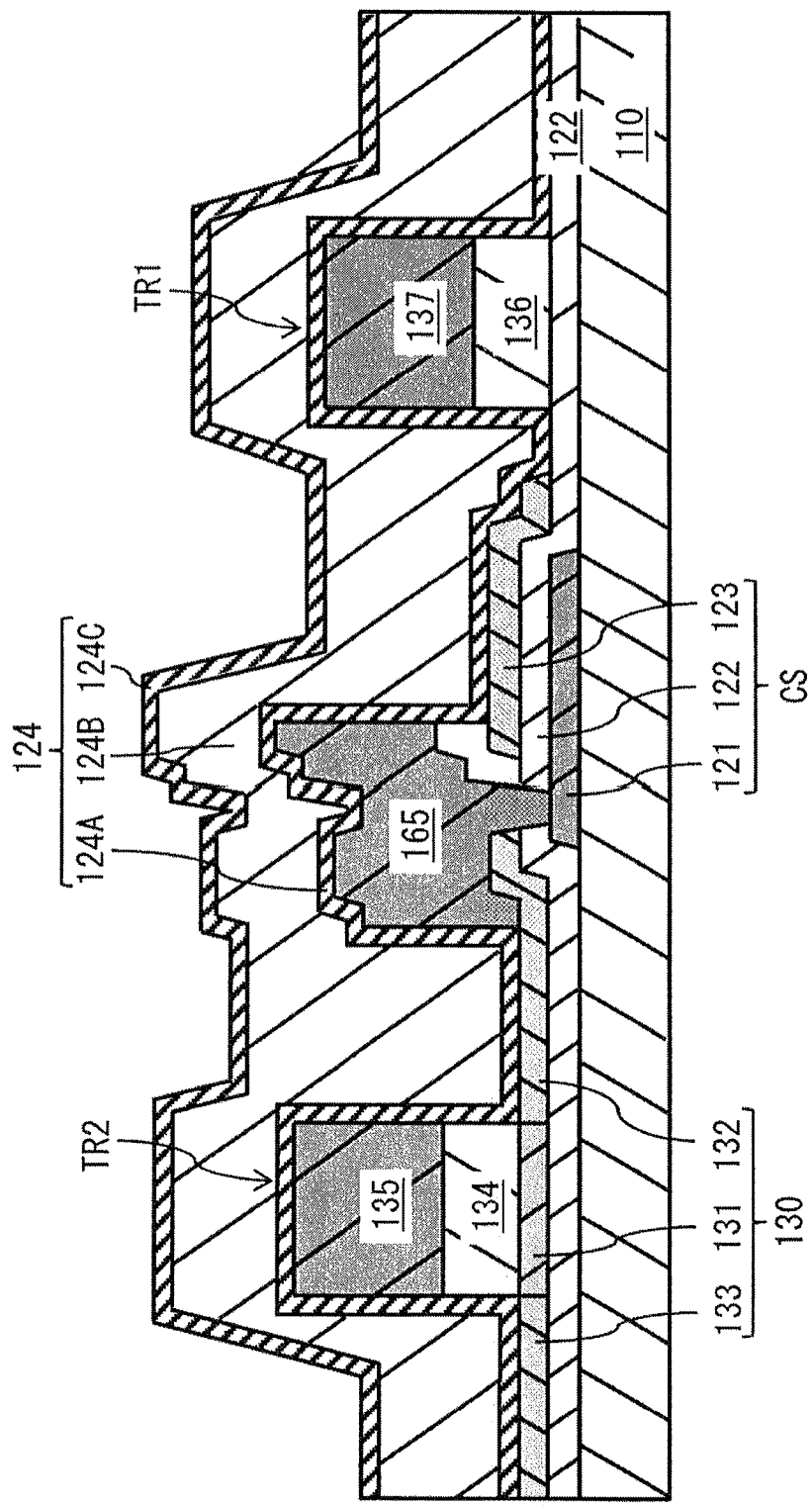
FIG. 6H is a schematic cross-sectional view of a TFT substrate according to the comparative example for illustration of an example process following the process illustrated in FIG. 6G.

Next, sputtering may be performed, for example, to form a lower inorganic film 124A. CVD may be performed, for example, to further form an intermediate inorganic film 124B. Sputtering may be performed, for example, to further form an upper inorganic film 124C, as illustrated in FIGS. 6E, 6F, and 6G. An inorganic film 124 may thus be formed. Next, for example, the fifth mask having a predetermined pattern may be formed on the inorganic film 124. Dry-etching may then be performed to selectively remove the upper inorganic film 124C and the intermediate inorganic film 124B to form a contact hole 172 extending through the upper inorganic film 124C and the intermediate inorganic film 124B, as illustrated in FIG. 6H.

Figure 6I:
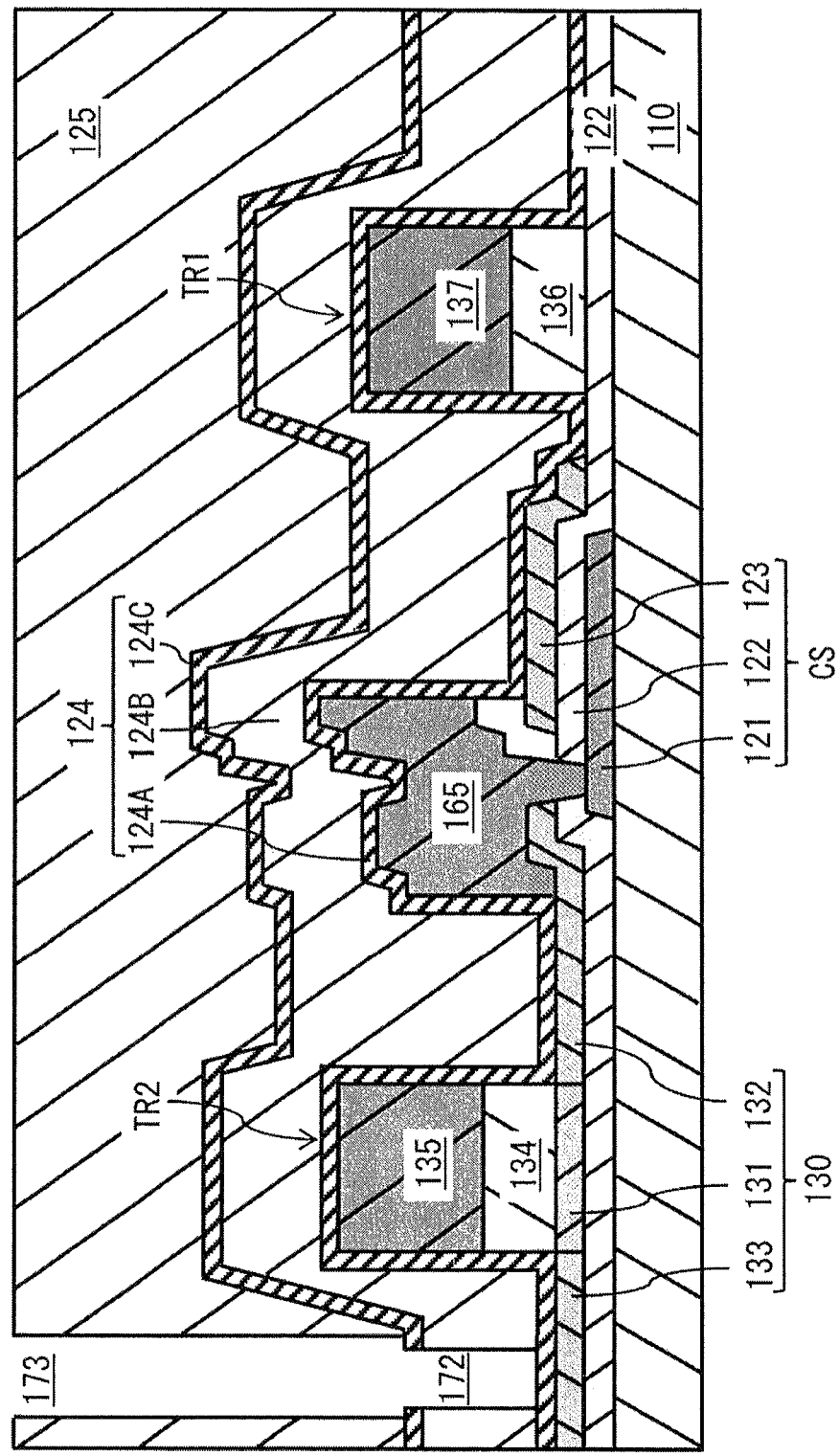
FIG. 6I is a schematic cross-sectional view of a TFT substrate according to the comparative example for illustration of an example process following the process illustrated in FIG. 6H.

Next, an organic insulating film 125 may be formed by coating, for example. Annealing may then be performed, for example, to allow the organic insulating film 125 to be solidified. The organic insulating film 125 according to the comparative example may include a photosensitive material. Exposure may then be performed via an exposure mask (sixth mask) having a predetermined pattern to selectively allow the organic insulating film 125 to alter its properties. An unaltered portion on the organic insulating film 125 may then be selectively removed. As a result, a contact hole 173 may be formed on the organic insulating film 125. The contact hole 173 may be in communication with the contact hole 172, as illustrated in FIG. 6I.

Figure 6J:
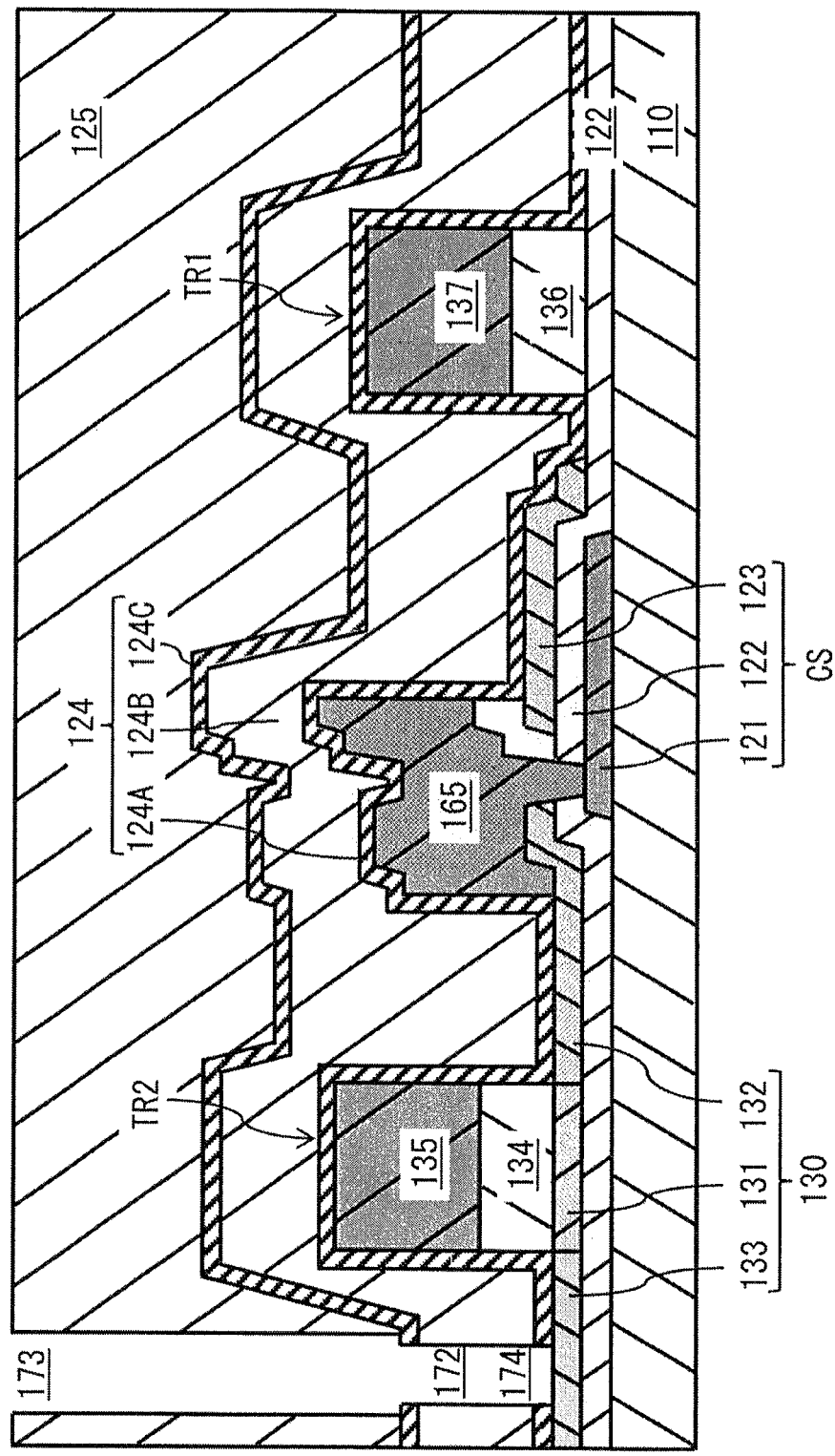
FIG. 6J is a schematic cross-sectional view of a TFT substrate according to the comparative example for illustration of an example process following the process illustrated in FIG. 6I.

Next, dry-etching may be performed with the organic insulating film 125 serving as a mask, for example, to selectively remove the lower inorganic film 124A via the contact holes 172 and 173. A contact hole 174 may thus be formed on the lower inorganic film 124A, as illustrated in FIG. 6J. The mask may then be removed.

Figure 6K:
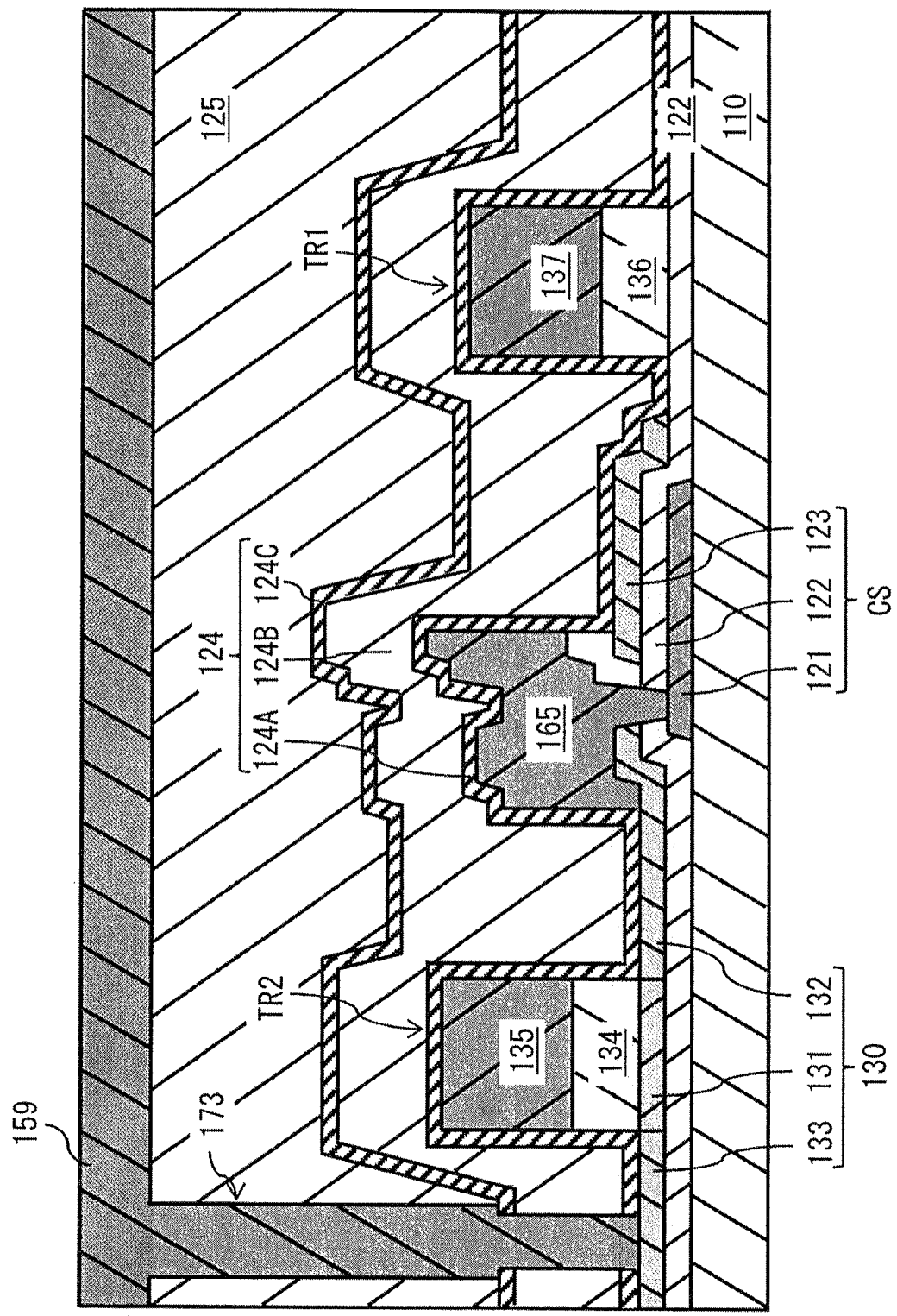
FIG. 6K is a schematic cross-sectional view of a TFT substrate according to the comparative example for illustration of an example process following the process illustrated in FIG. 6J.
Figure 6L:
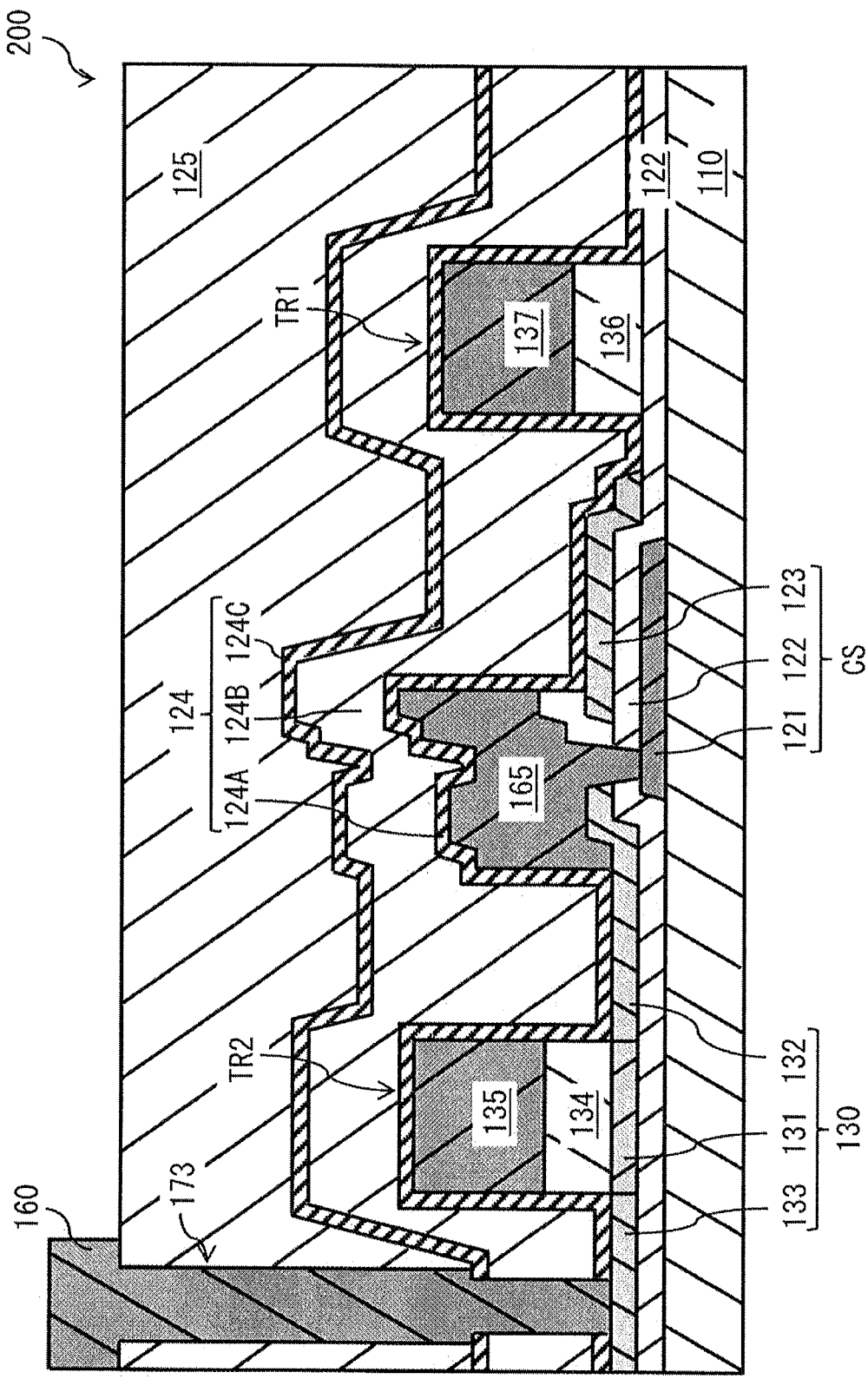
FIG. 6L is a schematic cross-sectional view of a TFT substrate according to the comparative example for illustration of an example process following the process illustrated in FIG. 6K.

Next, sputtering may be performed, for example, to form an electrode layer 159 on the entire surface having the contact holes 172, 173, and 174, as illustrated in FIG. 6K. The electrode layer 159 may be a metal layer to be processed into a drain electrode 160 in a later process. Thereafter, a seventh mask having a predetermined pattern may be formed on the electrode layer 159. Dry-etching may then be performed to selectively remove the electrode layer 159. Thereafter, annealing may be performed on the remained portion of the electrode layer 159 after the selective removal. The drain electrode 160 provided in contact with a drain region 133 may thus be formed, as illustrated in FIG. 6L. As described above, the TFT substrate 200 according to the comparative example may be manufactured.

In the TFT substrate 200 according to the comparative example, the gate wiring line 137 of the driving transistor TR1 may be electrically coupled to the source electrode 165 of the switching transistor TR2 within the TFT substrate 200. Outside of the TFT substrate 200, the drain electrode 160 of the switching transistor TR2 may be electrically coupled to one of signal lines DTL. The gate electrode 135 of the switching transistor TR2 may be electrically coupled to one of scanning lines WSL via a wiring line within the TFT substrate 200.

[Example Effects]

Next, some effects of the TFT substrate 13 and the organic electroluminescent device 1 including the TFT substrate 13, according to the example embodiment, will now be described with reference to a comparison with the TFT substrate 200 according to the comparative example.

With an increasing need for high-definition organic electroluminescent devices, a contact size has been reduced. Contact holes provided on a photosensitive organic film, however, can expand in size, making it difficult to achieve a high-definition organic electroluminescent device.

In any of the example embodiments, the hard mask metal 140 has the openings 155a to 155d at portions facing the contact holes 125a to 125d and 124a to 124h respectively provided on the inorganic insulating film 124 and the organic insulating film 125. The hard mask metal 140 is provided on the surface of the organic insulating film 125. In a process of manufacturing the TFT substrate 13, selective etching may be performed via the openings 155a to 155d on the hard mask metal 155. This makes it possible to provide the contact holes 125a to 125d and 124a to 124h respectively on the inorganic insulating film 124 and the organic insulating film 125. As the openings on the hard mask metal 155 define sizes of the contact holes 125a to 125d and 124a to 124h, a reduction of the openings in size makes it possible to reduce in size the contact holes 125a to 125d and 124a to 124h. It is therefore possible to provide the TFT substrate 13 having the contact holes 125a to 125d and 124a to 124h appropriate for contributing to achievement of a high-definition organic electroluminescent device, as well as to provide the organic electroluminescent device 1 including the TFT substrate 13. In any of the example embodiments, using the hard mask metal 155 in a manufacturing process makes it possible to reduce, in number, masks used in the manufacturing process.

In some of the example embodiments, the inorganic insulating film 124 may be provided in contact with the surfaces of the driving transistor TR1 and the switching transistor TR2. This makes it possible to suppress hydrogen included in the organic insulating film 125 from being supplied to the driving transistor TR1 and the switching transistor TR2. As a result, it is possible to extend a device life.

In some of the example embodiments, the contact holes 125a to 125d and 124a to 124h may be provided above the driving transistor TR1 and the switching transistor TR2. The surface of the TFT substrate 13 therefore allows electrical coupling between devices including the driving transistor TR1, the switching transistor TR2, and the storage capacitor CS in the pixel circuit 11-1. The surface of the TFT substrate 13 further allows electrical coupling between predetermined devices in the pixel circuit 11-1 and the organic electroluminescent device 11-2.

In some of the example embodiments, the inorganic insulating film 124 and the organic insulating film 125 may cover the driving transistor TR1, the switching transistor TR2, and the storage capacitor CS. This makes it possible to suppress hydrogen included in the organic insulating film 125 from being supplied to the driving transistor TR1 and the switching transistor TR2. As a result, it is possible to extend a device life.

In some of the example embodiments, the contact holes 125c, 124c, and 124g may be provided above a region including the boundary between the switching transistor TR2 and the storage capacitor CS. Furthermore, the source electrode 142 is electrically coupled to the switching transistor TR2 and the storage capacitor CS via the contact holes 125c, 124c, and 124g. This makes it possible to easily electrically couple the switching transistor TR2 and the storage capacitor CS, compared with a case where contact holes are respectively provided above the source region 132 and the storage capacitor CS, for example.

Although the technology has been described with reference to the example embodiments and the modification examples, the technology is not limited thereto, but may be modified in a wide variety of ways. It should be appreciated that the effects described herein are mere examples. Effects of an example embodiment of the technology are not limited to those described herein. The technology may further include any effect other than those described herein.

Furthermore, the technology encompasses any possible combination of some or all of the various embodiments and the modifications described herein and incorporated herein.

For example, it is possible to achieve at least the following configurations from the above-described example embodiments of the technology.

(1) A thin-film transistor substrate including:
a pixel circuit including a thin film transistor;
an interlayer insulating film having contact holes, the interlayer insulating film covering the pixel circuit;
electrodes exposed above a surface of the interlayer insulating film, the electrodes being electrically coupled to the pixel circuit via the contact holes; and
a hard mask metal having openings at portions facing the contact holes, the hard mask metal being provided on the surface of the interlayer insulating film.

(2) The thin-film transistor substrate according to (1), in which the interlayer insulating film is a laminate including an inorganic insulating film and an organic insulating film.

(3) The thin-film transistor substrate according to (1) or (2), in which the inorganic insulating film is in contact with a surface of the thin film transistor.

(4) The thin-film transistor substrate according to (3), in which the contact holes are provided above the thin film transistor.

(5) The thin-film transistor substrate according to (3), in which
the pixel circuit further includes a storage capacitor, and
the interlayer insulating film covers the thin film transistor and the storage capacitor, the interlayer insulating film being in contact with the surface of the thin film transistor and a surface of the storage capacitor.

(6) The thin-film transistor substrate according to (5), in which
the contact holes are provided above a region including a boundary between the thin film transistor and the storage capacitor, and
the electrodes are electrically coupled to the thin film transistor and the storage capacitor via the contact holes.

(7) A luminescent device including:
a thin-film transistor substrate including
a pixel circuit including a thin film transistor,
an interlayer insulating film having contact holes, the interlayer insulating film covering the pixel circuit,
electrodes exposed above a surface of the interlayer insulating film, the electrodes being electrically coupled to the pixel circuit via the contact holes, and
a hard mask metal having openings at portions facing the contact holes, the hard mask metal being provided on the surface of the interlayer insulating film;
a luminescent panel including a luminescent element per pixel, the luminescent panel being provided on the thin-film transistor substrate; and
a driving circuit configured to drive the luminescent panel, the driving circuit being provided on the thin-film transistor substrate.

In the thin-film transistor substrate and the luminescent device according to any example embodiment of the technology, the hard mask metal has the openings at the portions facing the contact holes provided on the interlayer insulating film. The hard mask metal is provided on the surface of the interlayer insulating film. In a process of manufacturing the thin-film transistor substrate, selective etching may be performed via the openings on the hard mask metal. This makes it possible to provide the contact holes on the interlayer insulating film. As the openings of the hard mask metal define sizes of the contact holes, a reduction of the openings in size makes it possible to reduce in size the contact holes.

With the thin-film transistor substrate and the luminescent device according to any example embodiment of the technology, where the openings of the hard mask metal define the contact holes in size, it is possible to provide the thin-film transistor substrate having the contact holes appropriate for contributing achievement of a high-definition organic electroluminescent device, as well as to provide the luminescent device including the thin-film transistor substrate. It should be appreciated that the effects described herein are mere examples. Effects of any example embodiment of the technology are not limited to those described herein. The technology may further include any effect other than those described herein.

Although the technology has been described in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. Moreover, no element or component in this technology is intended to be dedicated to the public regardless of whether the element or component is explicitly recited in the following claims.

What is claimed is:

1. A thin-film transistor substrate comprising:
   a pixel circuit including a thin film transistor, wherein the pixel circuit further includes a storage capacitor;
   an interlayer insulating film having contact holes, the interlayer insulating film covering the pixel circuit, wherein the interlayer insulating film is a laminate including an inorganic insulating film and an organic insulating film, the interlayer insulating film covers the thin film transistor and the storage capacitor, and the interlayer insulating film is in contact with a surface of the thin film transistor and a surface of the storage capacitor;
   electrodes exposed above a surface of the interlayer insulating film, the electrodes being electrically coupled to the pixel circuit via the contact holes; and
   a hard mask metal having openings at portions facing the contact holes, the hard mask metal being provided on the surface of the interlayer insulating film.

2. The thin-film transistor substrate according to claim 1, wherein the contact holes are provided above the thin film transistor.

3. The thin-film transistor substrate according to claim 1, wherein
   the contact holes are provided above a region including a boundary between the thin film transistor and the storage capacitor, and
   the electrodes are electrically coupled to the thin film transistor and the storage capacitor via the contact holes.

4. A luminescent device comprising:
   a thin-film transistor substrate including
      a pixel circuit including a thin film transistor, wherein the pixel circuit further includes a storage capacitor,
      an interlayer insulating film having contact holes, the interlayer insulating film covering the pixel circuit, wherein the interlayer insulating film is a laminate including an inorganic insulating film and an organic insulating film, the interlayer insulating film covers the thin film transistor and the storage capacitor, and the interlayer insulating film is in contact with a surface of the thin film transistor and a surface of the storage capacitor,
      electrodes exposed above a surface of the interlayer insulating film, the electrodes being electrically coupled to the pixel circuit via the contact holes, and
      a hard mask metal having openings at portions facing the contact holes, the hard mask metal being provided on the surface of the interlayer insulating film;
   a luminescent panel including a luminescent element per pixel, the luminescent panel being provided on the thin-film transistor substrate; and
   a driving circuit configured to drive the luminescent panel, the driving circuit being provided on the thin-film transistor substrate.

* * * * *